(12) United States Patent
Farrar et al.

(10) Patent No.: US 8,498,171 B2
(45) Date of Patent: Jul. 30, 2013

(54) DISTRIBUTED SEMICONDUCTOR DEVICE METHODS, APPARATUS, AND SYSTEMS

(75) Inventors: Paul A. Farrar, Bluffton, SC (US); Hussein I Hanafi, Basking Ridge, NJ (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/567,839

(22) Filed: Aug. 6, 2012

(65) Prior Publication Data

US 2012/0302006 A1 Nov. 29, 2012

Related U.S. Application Data

(62) Division of application No. 13/112,863, filed on May 20, 2011, now Pat. No. 8,237,254, which is a division of application No. 11/514,557, filed on Aug. 31, 2006, now Pat. No. 7,952,184.

(51) Int. Cl.
*G11C 7/00* (2006.01)

(52) U.S. Cl.
USPC .......... 365/222; 365/49.1; 365/201; 365/145; 365/149; 365/51; 257/687; 257/777; 361/790; 361/735

(58) Field of Classification Search
USPC .................. 365/222, 49.1, 201, 145, 149, 51, 365/63, 72; 257/687, 777; 361/790, 735
See application file for complete search history.

(56) References Cited

U.S. PATENT DOCUMENTS

| | | | |
|---|---|---|---|
| 4,807,194 A | 2/1989 | Yamada et al. | |
| 4,923,521 A | 9/1990 | Venntolo | |
| 5,202,754 A | 4/1993 | Bertin et al. | |
| 5,270,261 A | 12/1993 | Bertin et al. | |
| 5,457,345 A | 10/1995 | Cook et al. | |
| 5,656,553 A | 8/1997 | Leas et al. | |
| 5,719,070 A | 2/1998 | Cook et al. | |
| 5,719,438 A | 2/1998 | Beilstein, Jr. et al. | |
| 5,723,894 A | 3/1998 | Ueno et al. | |
| 5,731,945 A | 3/1998 | Bertin et al. | |
| 5,781,031 A * | 7/1998 | Bertin et al. | 326/39 |
| 5,818,748 A * | 10/1998 | Bertin et al. | 365/51 |
| 5,892,288 A | 4/1999 | Muraki et al. | |
| 5,995,379 A * | 11/1999 | Kyougoku et al. | 361/803 |
| 6,136,689 A | 10/2000 | Farrar | |
| 6,337,513 B1 | 1/2002 | Clevenger et al. | |

(Continued)

FOREIGN PATENT DOCUMENTS

SG 151656 9/2011
WO WO-2008051415 5/2008

OTHER PUBLICATIONS

"Chinese Application Serial No. 200780038876.3, Office Action mailed May 28, 2010", 2 pgs.

(Continued)

*Primary Examiner* — Telly Green
(74) *Attorney, Agent, or Firm* — Schwegman, Lundberg & Woessner, P.A.

(57) ABSTRACT

Some embodiments include a device having a number of memory cells and associated circuitry for accessing the memory cells. The memory cells of the device may be formed in one or more memory cell dice. The associated circuitry of the device may also be formed in one or more dice, optionally separated from the memory cell dice.

22 Claims, 23 Drawing Sheets

U.S. PATENT DOCUMENTS

| | | |
|---|---|---|
| 6,507,117 B1 | 1/2003 | Hikita et al. |
| 6,557,013 B1 | 4/2003 | Ziff et al. |
| 6,670,719 B2 | 12/2003 | Eldridge et al. |
| 6,756,305 B1 | 6/2004 | Conn |
| 6,760,224 B2 | 7/2004 | Moden et al. |
| 6,878,396 B2 | 4/2005 | Farrar et al. |
| 6,908,785 B2 | 6/2005 | Kim |
| 6,909,171 B2 | 6/2005 | Eldridge et al. |
| 6,958,287 B2 | 10/2005 | Farrar et al. |
| 7,754,532 B2 | 7/2010 | Farrar |
| 7,952,184 B2 | 5/2011 | Farrar et al. |
| 8,237,254 B2 | 8/2012 | Farrar et al. |
| 2002/0025587 A1 | 2/2002 | Wada |
| 2002/0141233 A1* | 10/2002 | Hosotani et al. ............... 365/158 |
| 2003/0178228 A1* | 9/2003 | Sung et al. .................... 174/259 |
| 2004/0007771 A1 | 1/2004 | Shin et al. |
| 2004/0070063 A1 | 4/2004 | Leedy |
| 2004/0162971 A1 | 8/2004 | Joy et al. |
| 2004/0238933 A1 | 12/2004 | Chen et al. |
| 2004/0262772 A1 | 12/2004 | Ramanathan et al. |
| 2005/0095733 A1 | 5/2005 | Priewasser et al. |
| 2005/0269665 A1 | 12/2005 | Wylie et al. |
| 2005/0280160 A1* | 12/2005 | Kim et al. ..................... 257/777 |
| 2006/0170112 A1 | 8/2006 | Tanaka |
| 2006/0235577 A1 | 10/2006 | Ikeda et al. |
| 2006/0292752 A1* | 12/2006 | Connell et al. ................ 438/126 |
| 2007/0007983 A1 | 1/2007 | Salmon |
| 2007/0158807 A1* | 7/2007 | Lu et al. ....................... 257/686 |
| 2007/0210447 A1* | 9/2007 | Kinsley ......................... 257/723 |
| 2008/0054489 A1 | 3/2008 | Farrar et al. |
| 2008/0096320 A1 | 4/2008 | Farrar |
| 2010/0193838 A1* | 8/2010 | Farrar ........................... 257/190 |
| 2010/0271777 A1 | 10/2010 | Farrar |
| 2011/0222328 A1 | 9/2011 | Farrar et al. |

OTHER PUBLICATIONS

"Chinese Application Serial No. 200780038876.3, Office Action mailed May 26, 2011", with English translation, 7 pgs.

"Chinese Application Serial No. 200780038876.3, Office Action mailed Aug. 11, 2011", 3 pgs.

"Chinese Application Serial No. 200780038876.3, Office Action mailed Dec. 8, 2011", 2 pgs.

"Chinese Application Serial No. 200780038876.3, Office Action mailed Dec. 16, 2010-2011", with English translation, 6 pgs.

"Chinese Application Serial No. 200780038876.3, Response filed Oct. 14, 2011 to Office Action mailed Aug. 11, 2011", 4 pgs.

"Chinese Application Serial No. 200780038876.3, Response filed Feb. 14, 2011 to Office Action mailed Dec. 16, 2010", with English translation, 7 pgs.

"Chinese Application Serial No. 200780038876.3, Response filed Feb. 8, 2012 to Office Action mailed Dec. 8, 2011", 4 pgs.

"Chinese Application Serial No. 200780038876.3, Response to Office Action mailed May 28, 2010", 11 pgs.

"European Application Serial No. 07839619.9, Office Action mailed Mar. 19, 2010", 3 pgs.

"European Application Serial No. 07839619.9, Response filed Jul. 28, 2010 to Office Action", 16 pgs.

"European Application Serial No. 07839619.9, Summon to attend Oral Proceeding mailed Feb. 22, 2011", 5 pgs.

"Taiwanese Application Serial No. 096139355, Office Action mailed Oct. 20, 2011", 10 pgs.

"Taiwanese Application Serial No. 096139355, Response filed Jan. 4, 2012 to Office Action mailed Oct. 20, 2011", 4 pgs.

Miller, L. F, "Multiple Reflow Titanium Platinum Metallurgy", IBM Technical Disclosure Bulletin, (Jun. 1973), 39.

* cited by examiner

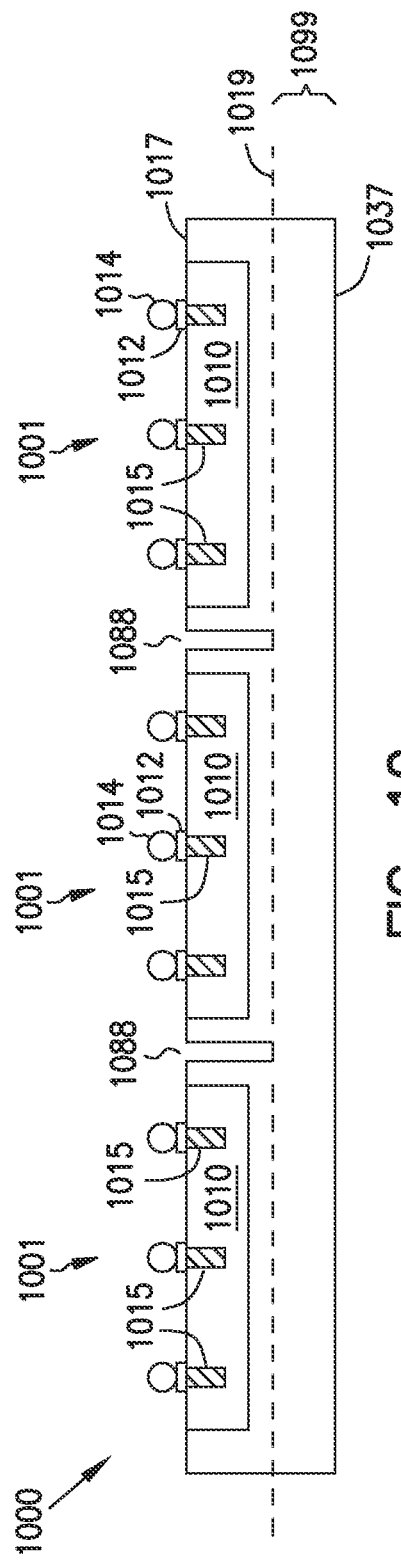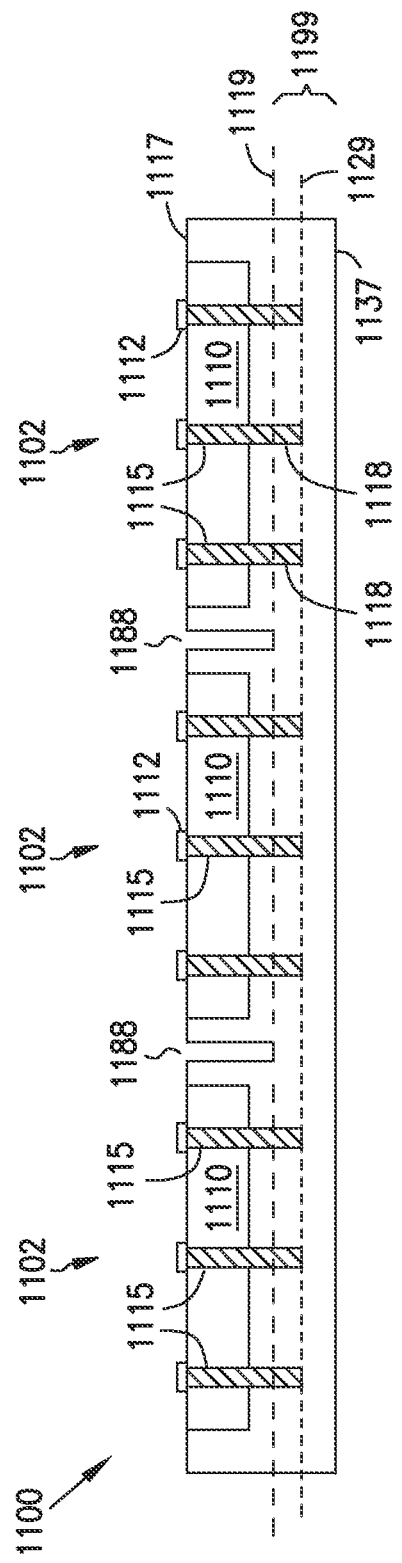

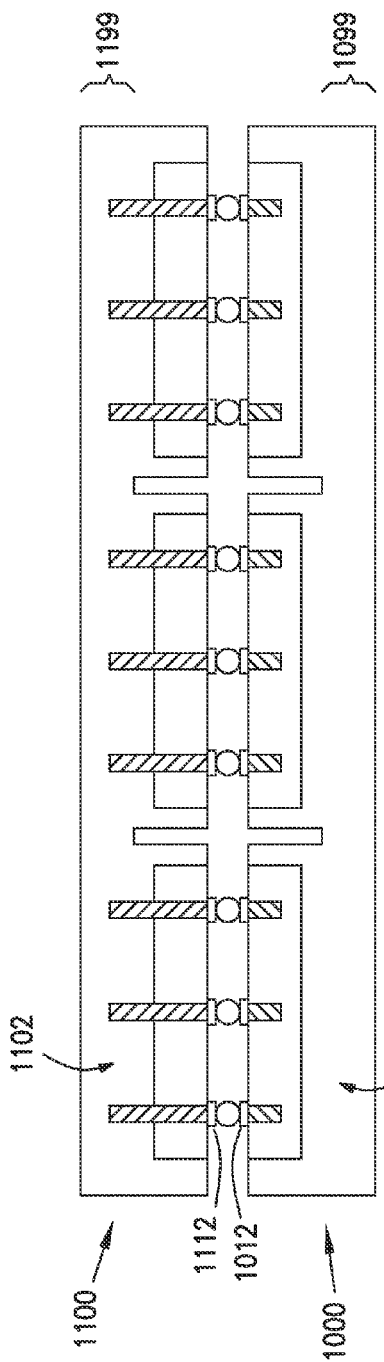
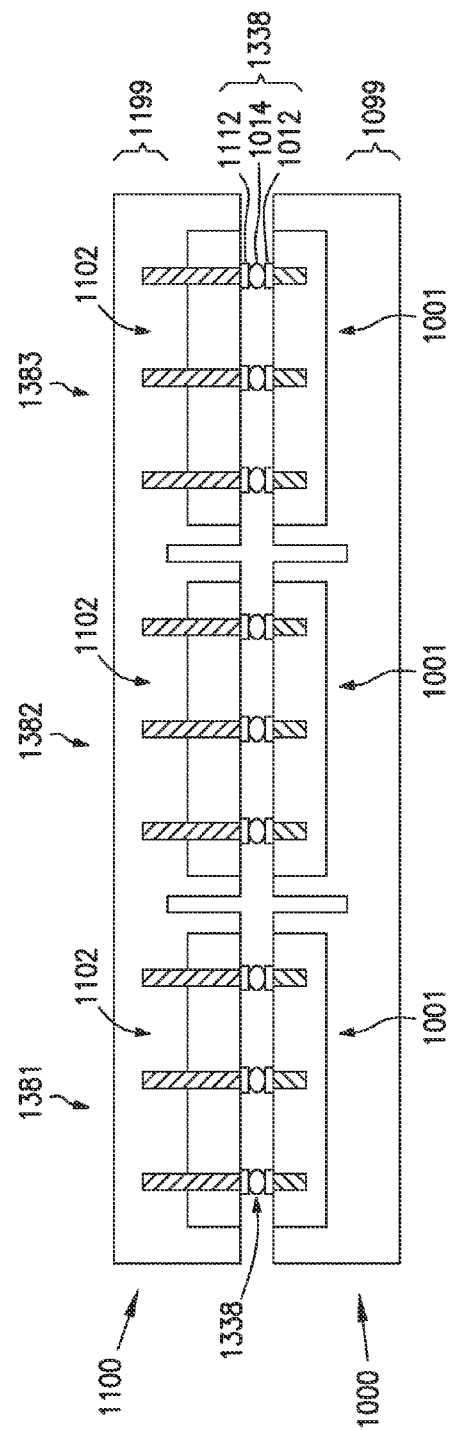

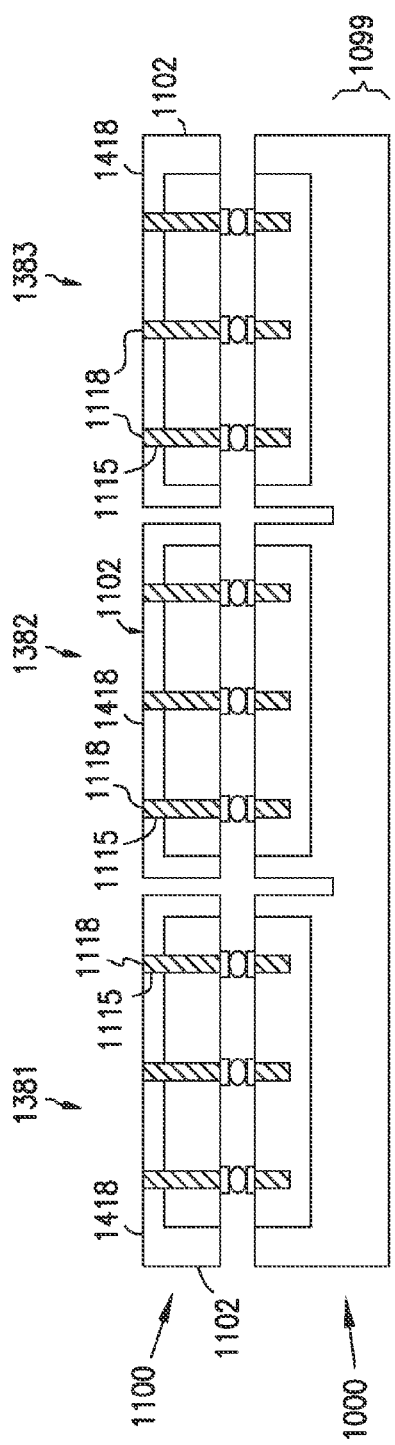
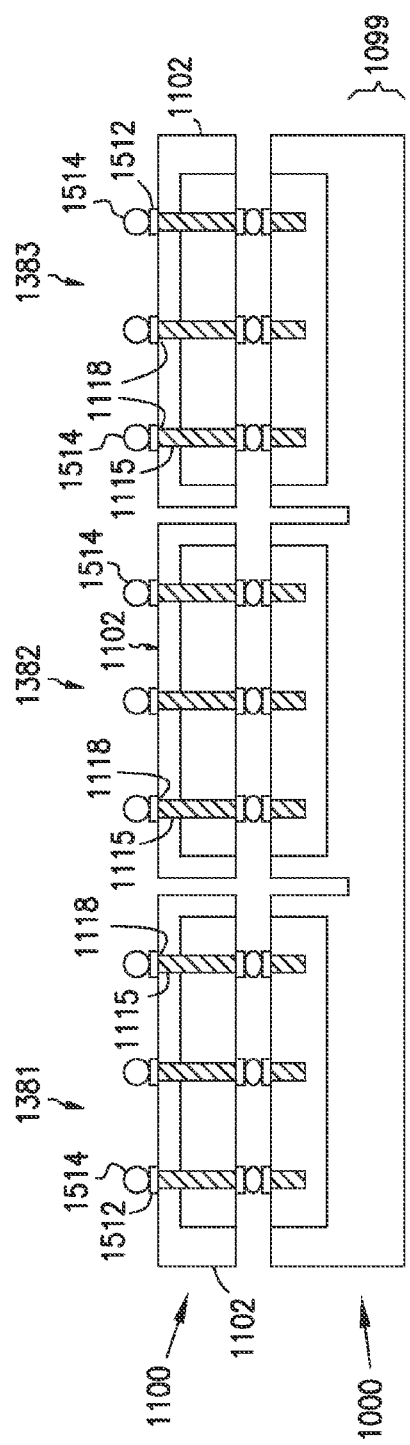

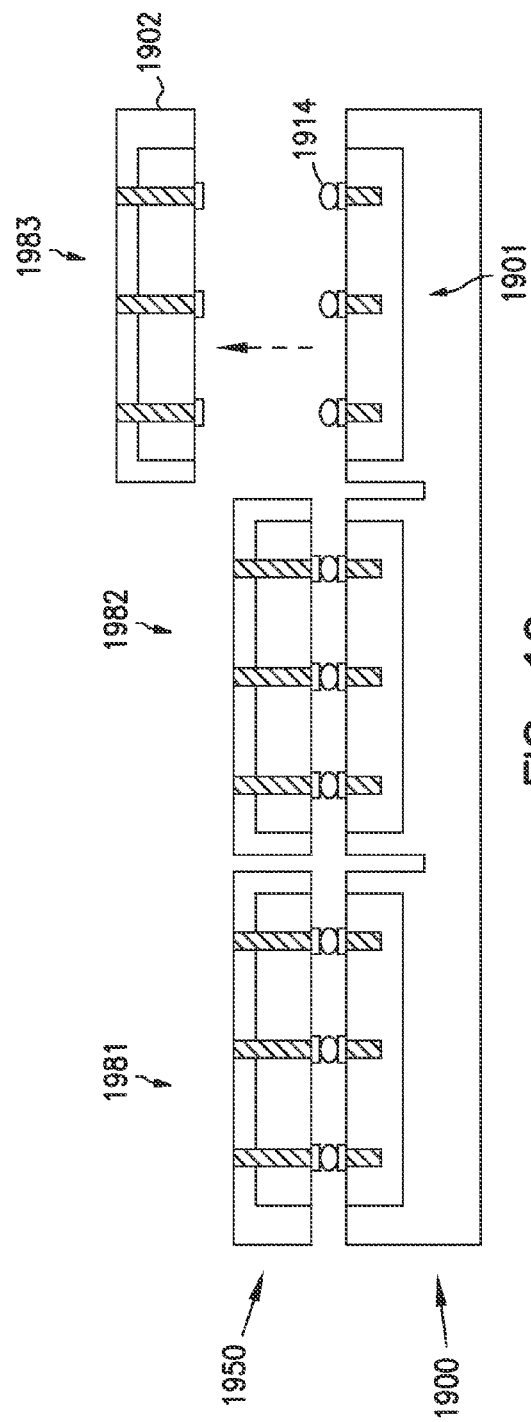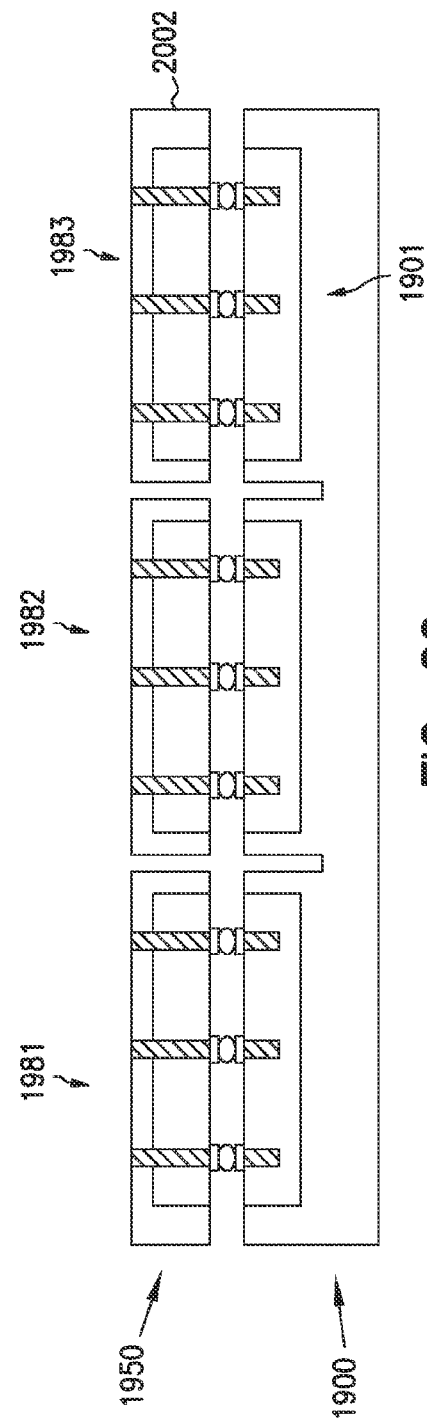

DISTRIBUTED SEMICONDUCTOR DEVICE METHODS, APPARATUS, AND SYSTEMS

PRIORITY APPLICATION

This application is a divisional of U.S. application Ser. No. 13/112,863 filed May 20, 2011, now U.S. Pat No. 8,237,254, which is a divisional of U.S. application Ser. No. 11/514,557, filed Aug. 31, 2006, now issued as U.S. Pat. No. 7,952,184, both of which are incorporated herein by reference in their entirety.

FIELD

The present disclosure relates generally to semiconductor devices, including semiconductor devices in integrated circuit packages.

BACKGROUND

Semiconductor devices such as memory devices and processors are widely used in computers and electronic products. A memory device often has many memory cells to store data. The memory device may also include associated support circuitry to access the memory cells and to provide communication with other devices. In some memory devices, the memory cells and the support circuitry are formed as a single semiconductor die enclosed in an integrated circuit package or chip.

For some electronic products, to increase data storage capacity for a given die size, features in the device (e.g., transistors and connecting elements) may be shrunk to create more room for additional memory cells. Additional conductive lines in the device may also be created to accommodate the additional memory cells. Since the die may remain the same size, the additional conductive lines may cause the total number of conductive lines to become dense.

Dense conductive lines in the device may increase capacitive loading, capacitive coupling, or both, leading to possible poor device performance. Moreover, shrinking feature size in semiconductor devices may be limited by a minimum achievable dimension. Thus, in devices where the features are already at the minimum achievable dimension, further reduction in the dimension of the device features may be unachievable. Increasing data storage density in these devices may be difficult. Therefore, alternative fabrication and packaging techniques may be needed to achieve increased data storage capacity in semiconductor devices.

BRIEF DESCRIPTION OF DRAWINGS

FIG. 10 through FIG. 20 show processes of forming memory devices from a wafer stack of two wafers according to an embodiment of the invention.

DETAILED DESCRIPTION OF DRAWING

Figure 1:
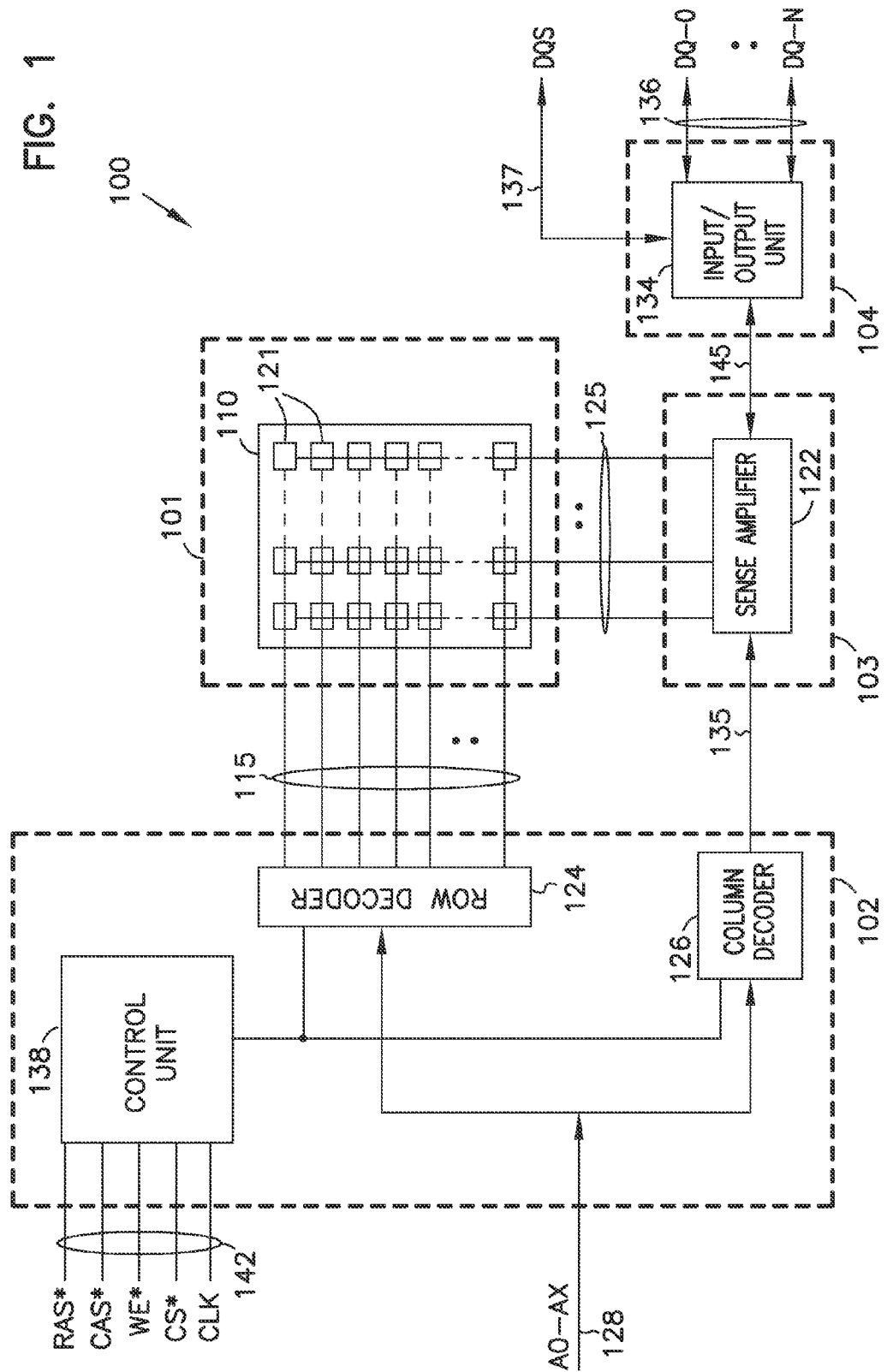
FIG. 1 is a block diagram of a memory device in which portions of the memory device may be distributed in multiple dice according to an embodiment of the invention.

FIG. 1 shows a block diagram of a memory device 100. Memory device 100 may comprise a dynamic random access memory (DRAM) device, static random access memory (SRAM) device, flash memory device, and/or other memory devices. In addition to the memory device circuit elements shown, one skilled in the art will readily recognize that memory device 100 may include other circuit elements. These other circuit elements of memory device 100 are omitted from FIG. 1 for clarity.

Memory device 100 may include a number of device portions, such as device portions 101, 102, 103 and 104. Device portion 101 includes memory array 110 having memory cells 121 arranged in rows and columns, word lines 115, and bit lines 125. In some embodiments, memory array 110 may include additional circuitry (e.g., source followers) for accessing memory cells 121 from outside memory device 100 so that memory cells 121 may be tested.

Device portion 103 includes a sense amplifier 122, which responds to signals on bit lines 125 to determine the values of data transferred to and from memory cells 121.

Device portion 104 includes an input and output unit 134 to transfer data between memory cells 121 and data lines 136. Data signals DQ0 through DQN on lines 136 represent data transferred to and from memory cells 121. Memory device 100 may include one or more strobe lines 137 to transfer strobe signals DQS. The DQS signals may represent timing information associated with the DQ0 through DQN signals.

Device portion 102 includes a row decoder 124, a column decoder 126, and a control unit 138. Row and column decoders 124 and 126 respond to address signals A0 through AX provided on address lines 128 to access memory cells 121 via word lines 115 and bit lines 125. The signals A0 through AX may carry information to select row addresses and column addresses of memory cells 121. Control unit 138 controls the operations of memory device 100 based on control signals on control lines 142. Examples of the control signals include a row address strobe signal RAS*, a column address strobe signal CAS*, a write select signal WE*, a chip select signal CS*, and a clock signal CLK. The operations of memory device 100 include a write operation and a read operation.

The write operation transfers data from data lines 136 to memory cells 121. The read operation transfers data from memory cells 121 to data lines 136. Address signals A0 through AX provide addresses of the memory cells that are being accessed in the read or write operation.

As shown in FIG. 1, device portions 101 through 104 may include one or more circuit elements of device 100. For example, device portion 101 may include memory cells and associated connections for word lines 115 and bit lines 125. In another example, device portion 102 may include control unit 138 and row and column decoders 124 and 126. FIG. 1 shows memory device 100 with four device portions 101 through 104 as an example. In some embodiments, memory device 100 may include a different number of device portions, and the circuit elements may be partitioned among the device portions in a different manner.

In some embodiments, memory device 100 may be formed so as to comprise multiple semiconductor dice. In this case, device portions 101 through 104 of memory device 100 may be distributed among the multiple dice such that at least one, but fewer than all of device portions 101 through 104 may be formed in each one of the multiple dice. For example, memory cells 121 and associated word lines 115 and bit lines 125 may be formed in one of the multiple dice, and the rest of memory device 100 (e.g., device portions 102 through 104) may be formed in one or more other dice of the multiple dice. A connection corresponding to at least word lines 115, bit lines 125, and signal lines 135 and 145, may be formed among the multiple dice to provide communication transferring signals including data signals, address signals, control signals, and other signals) among device portions 101 through 104 or between at least one of the device portions 101 through 104 and other components that coupled to memory device 100. In some embodiments, memory device 100 may be may be formed from multiple dice in which the multiple die may be arranged in a stack.

Figure 2:
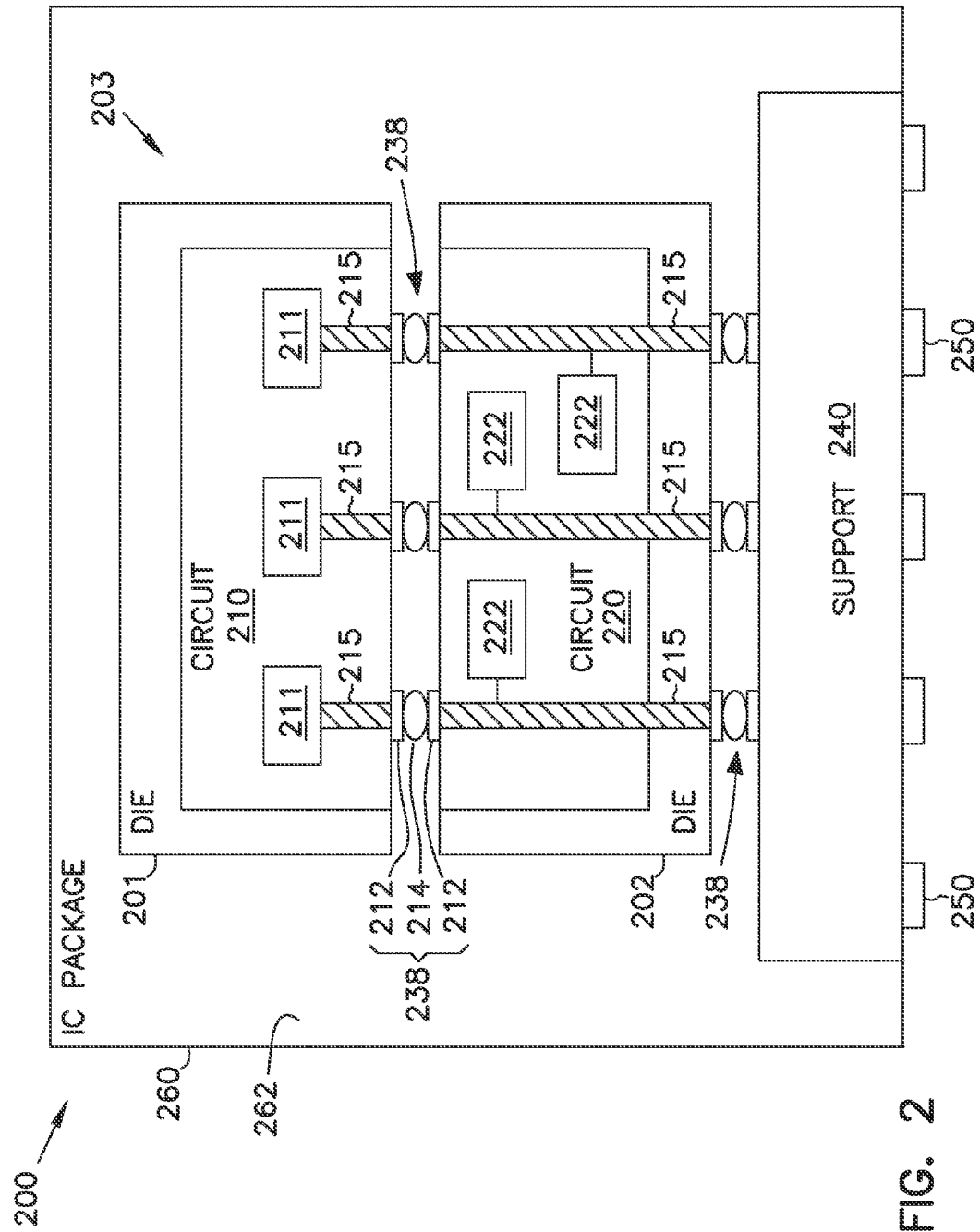
FIG. 2 shows a partial cross section of an integrated circuit (IC) package having a memory device with portions of the memory device being distributed in a stack of two dice according to an embodiment of the invention.

FIG. 2 shows a partial cross section of an embodiment of an IC package 200 having a memory device 203 with portions of memory device 203 being distributed in a stack of two dice 201 and 202. Memory device 203 may be similar to or identical to memory device 100 shown in FIG. 1.

For ease of following the description of the drawings in this disclosure, the features in the drawings may be shown in exaggerated dimensions. Further, for clarity, some or all features of a device (e.g., memory device 203) shown in the drawings herein may not have section line symbols (cross-hatch lines) when the features of the device are shown in a cross section view. In FIG. 2, die 201 includes a circuit 210 with circuit elements 211. Die 202 includes a circuit 220 with circuit elements 222. Joints 238 and conductive paths 215 may be coupled to circuits 210 and 220. FIG. 2 shows that at least one of conductive paths 215 passes through die 202 and may be coupled to at least one of joints 238.

Each joint 238 may be located between dice 201 and 202. Joint 238 may include two bond pads 212 and an electrically conductive adhesive material 214. In some embodiments, adhesive material 214 may be solder. At least one of bond pads 212 may include multiple layers. In some embodiments, the multiple layers of bond pads 212 may include one or more layers of a refractory metal, a layer of nickel, a layer of copper, and a layer of gold, alone or in any combination.

IC package 200 may include a support 240 coupled to memory device 203. Support 240 may comprise a ceramic or organic package substrate. Contacts 250 may be coupled to support 240 to enable communication to and from memory device 203. IC package 200 may further include an enclosure 260, which encloses at least a portion of support 240 and memory device 203, located in an interior 262. In some embodiments, interior 262 may be filled with a filling material, a gas, a liquid, or a combination thereof. The filling material may include a polymer material. The gas may include hydrogen, helium, or a mixture of hydrogen and helium. The gas may have a pressure greater than a pressure outside IC package 200. The liquid may include an organic liquid, such as carbon tetrachloride.

In FIG. 2, dice 201 and 202 may include semiconductor material (e.g., silicon). In some embodiments, dice 201 and 202 may be formed from different types of wafers. For example, die 201 may be formed from a bulk silicon wafer, and die 202 may be formed from a silicon-on-insulator (SOI) wafer. An example of a bulk silicon wafer includes a single crystal silicon wafer. Examples of an SOI wafer include silicon-on-silicon oxide wafers and silicon-on-sapphire wafers.

In some embodiments, using different materials for dice 201 and 202 may improve the performance of memory device 203. For example, in memory device 203, when only die 201 includes support circuitry such as a sense amplifier (e.g., sense amplifier 122 of FIG. 1), die 201 may be formed from a SOI wafer instead of from a bulk silicon wafer because, in comparison to a bulk silicon wafer, an SOI wafer may cause less parasitic capacitance in the circuit elements of the sense amplifier. In another example, in memory device 203, when only die 202 includes memory cells, such as memory cells 121 of FIG. 1, die 202 may be formed from a bulk silicon wafer instead of from a SOI wafer because the floating body effects of the SOI wafer may affect the operation of the memory cells.

As shown in FIG. 2, device portions (e.g., circuits 210 and 220) of memory device 203 are distributed among multiple dice (e.g., dice 201 and 202), as has been described with respect to device portions 101-104 of FIG. 1. In some embodiments, circuit elements 211 of circuit 210 may include memory cells, and circuit elements 222 of circuit 220 may include support circuitry such as decoders, sense amplifiers, one or more control units, and other circuitry of a functional memory device. Thus, as shown in FIG. 2, the memory cells of memory device 203 may be formed in only circuit 210 of die 201 whereas other circuitry of memory device 203 may be formed only in circuit 220 of die 202. Since each of circuits 210 and 220 may include only a portion of memory device 203, each of circuits 210 and 220 may be configured to perform only a portion and not the entire function of memory device 203. For example, circuit 210 of memory device 203 may be configured to perform only the function of holding data in memory cells of circuit 210, and circuit 220 of memory device 203 may be configured to perform a function of at least one of decoding function, a sensing function, data input and output functions, and other functions of a memory device.

As shown in FIG. 2, dice 201 and 202 may be stacked vertically on, or with respect to support 240. In other words, dice 201 and 202 may be stacked in a direction perpendicular to support 240. In comparison with a conventional memory device where all device portions are formed in a single die with a given dimension, the stacked arrangement of dice 201 and 202 of memory device 203, as shown in FIG. 2, may increase the storage density of memory device 203 for a given volume.

FIG. 2 shows an embodiment of an IC package 200 in which memory device 203 is arranged in a so-called a "flip chip" arrangement. In some embodiments, memory device 203 may have other arrangements within IC package 200.

Figure 3:
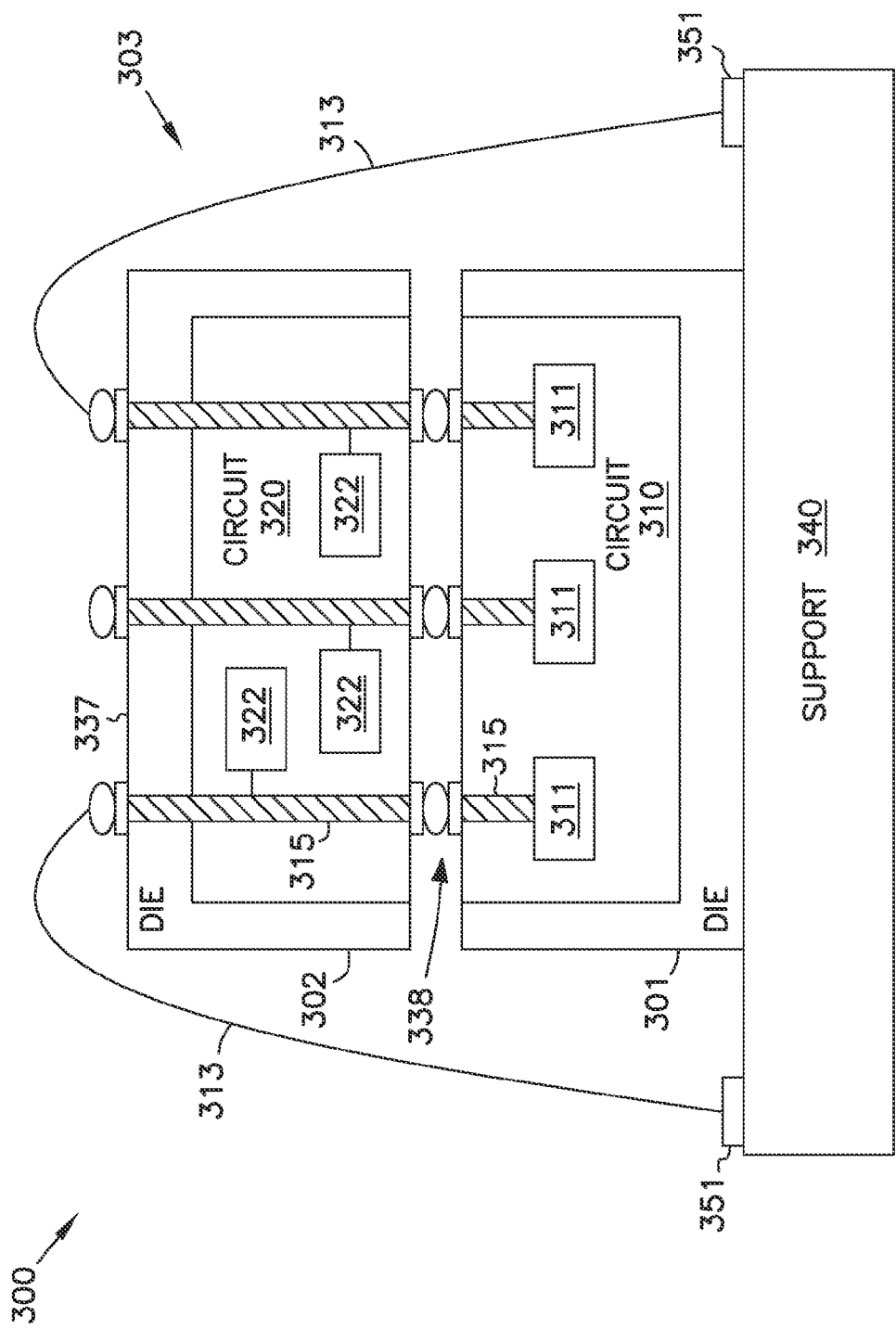
FIG. 3 shows a partial cross section of an IC package having a memory device with bonding wires arranged according to an embodiment of the invention.

FIG. 3 shows a partial cross section of an embodiment of an IC package 300 having a memory device 303 in a package with bonding wires. For clarity, IC package 300 is shown without an enclosure such as enclosure 260 of IC package 200 of FIG. 2. In FIG. 3, it can be seen that IC package 300 may include one or more memory devices 303 having multiple dice (e.g., die 301, die 302), and bonding wires 313 coupled to contacts 351 on a support 340. Communication to and from memory device 303 may be conducted through contacts 351. Die 301 may include circuit 310 with circuit elements 311. Die 302 may include circuit 320 with circuit elements 322. Joints 338 may be located between dice 301 and 302. In some embodiments, bonding wires 313 may be coupled to contacts 351 from joints 338 instead of from the top of die 302 as shown in FIG. 3. Thus, in these embodiments, some or all of the conductive paths 315 may pass through circuit 310 from joints 338, but not necessarily through die 302 to surface 337 of die 302.

Figure 4:
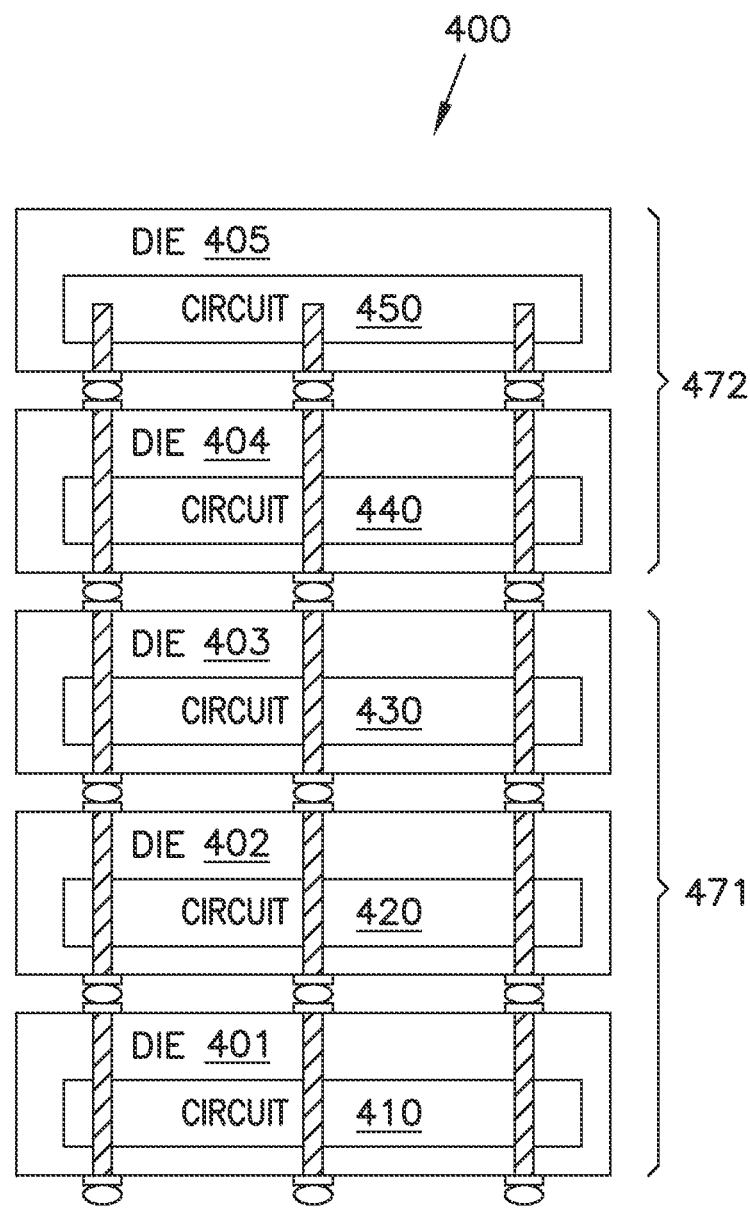
FIG. 4 shows a partial cross section of a memory device having a stack of more than two dice according to an embodiment of the invention.

FIG. 4 shows a partial cross section of an embodiment of a memory device 400 having a stack of more than two dice. Memory device 400 may be similar to or identical to memory device 203 of FIG. 2 or memory device 303 of FIG. 3, except with respect to the number of dice. In FIG. 4, memory device 400 includes multiple dice 401, 402, 403, 404, and 405 arranged in a stack. Dice 401 through 405 may be formed from different wafers. FIG. 4 shows dice 401 through 405 without a package. However, it should be noted that dice 401 through 405 may be enclosed in an IC package such as IC package 200 or 300 or other types of IC packages. In FIG. 4, each of dice 401 through 405 may include one or more of the corresponding circuits 410, 420, 430, 440, and 450. Dice 401 through 405 may be grouped into a first die group 471 and a second die group 472. FIG. 4 shows an example where die group 471 includes three dice 401, 402, and 403 and die group 472 includes two dice 404 and 405. In some embodiments, the number of dice within each of die groups 471 and 472 may vary. For example, die group 471 may include four dice and die group 472 may include only one die. Many other arrangements are possible.

Each of die groups 471 and 472 may include one or more portions of memory device 400. In some embodiments, the memory cell portion of memory device 400 may be included in only circuits 410, 420, and 430 of die group 471, and other device portions (e.g. decoder, sense amplifier, and control unit) of memory device 400 may be included in only circuits 440 and 450 of die group 472. In other embodiments, other combinations of the device portions of memory device 400 may be formed on and partitioned among die groups 471 and 472.

FIG. 4 shows memory device 400 having five dice as an example. In some embodiments, the total number of dice in memory device 400, the number of dice in each of die groups 471 and 472, or both, may vary. As described above, memory device 203, 303, and 400 in FIG. 2, FIG. 3, and FIG. 4 may be formed from different types of semiconductor wafers (e.g., bulk and/or SOI wafers, among others).

Figure 5:
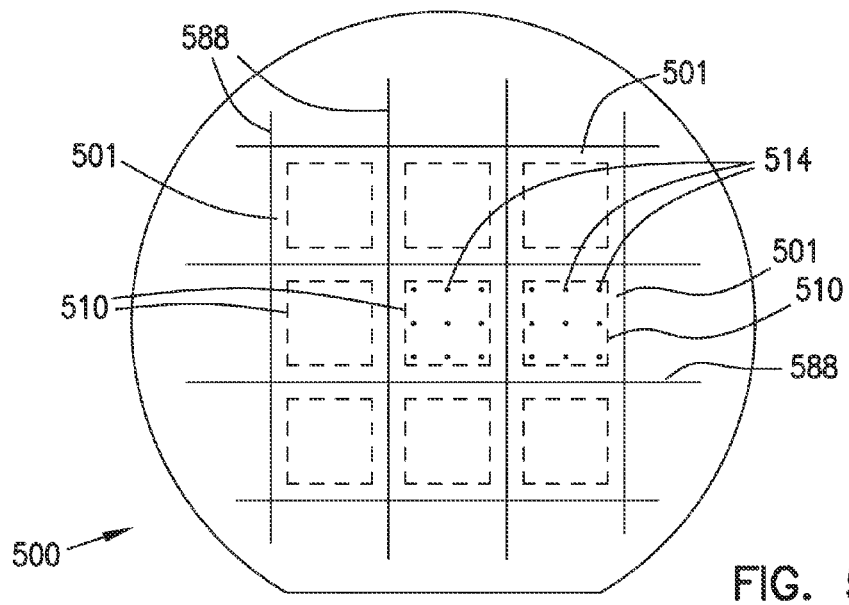
FIG. 5 and FIG. 6 show different views of a wafer with dice having first portions of memory devices according to an embodiment of the invention.
Figure 6:
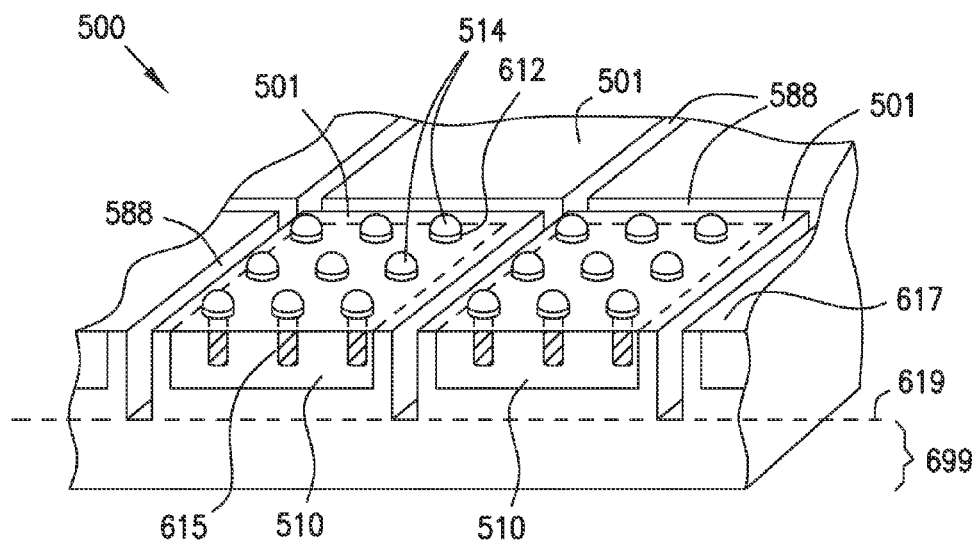

FIG. 5 and FIG. 6 show different views of an embodiment of a wafer 500 with dice having portions of memory devices. FIG. 5 shows a plan view of wafer 500. FIG. 6 shows a partial cross section of a portion of wafer 500, which may be made from semiconductor material (e.g., silicon). In some embodiments, wafer 500 may include a bulk silicon wafer. As shown in FIG. 5 and FIG. 6, wafer 500 includes a plurality of dice 501, and grooves 588. In some embodiments, grooves 588 may be formed by partially scribing or cutting wafer 500 from surface 617 (FIG. 6) of wafer 500 to some selected depth 619. As shown in FIG. 6, wafer portion 699 of wafer 500 holds the dice 501 together. The dice 501 may be separated from each other when wafer portion 699 is removed.

Each die 501 may include one or more circuits 510, conductive paths 615, bond pads 612, and adhesive materials 514. The circuits 510 may include circuit elements (e.g., memory cells, sense amplifiers, decoders), which are not shown in FIG. 5 and FIG. 6 for clarity. Conductive paths 615 (FIG. 6), which extend substantially perpendicularly from surface 617 of wafer 500 to some selected depth 619 within circuit 510, may provide connections and communications to and from circuit 510. In some embodiments, conductive paths 615 may include word lines and bit lines of memory device, such as word lines 115 and bit lines 125 of memory device 100 of FIG. 1.

In FIG. 5 and FIG. 6, adhesive materials 514 of die 501 may allow attachment or bonding of conductive paths 615 to other components. In some embodiments, adhesive materials 514 may include solder balls or solder bumps.

A portion of a memory device (e.g., memory device 100, 203, 303, or 400 of FIG. 1 through FIG. 4) may be formed in each die 501 such that circuit 510 of each die 501 may contain circuit elements of only a portion of the memory device. For example, a device portion containing memory cells of a memory device may be formed in each die 501 of wafer 500. Other device portions of the memory device (e.g., sense amplifiers, decoders, or both may be formed in another wafer different from wafer 500.

Figure 7:
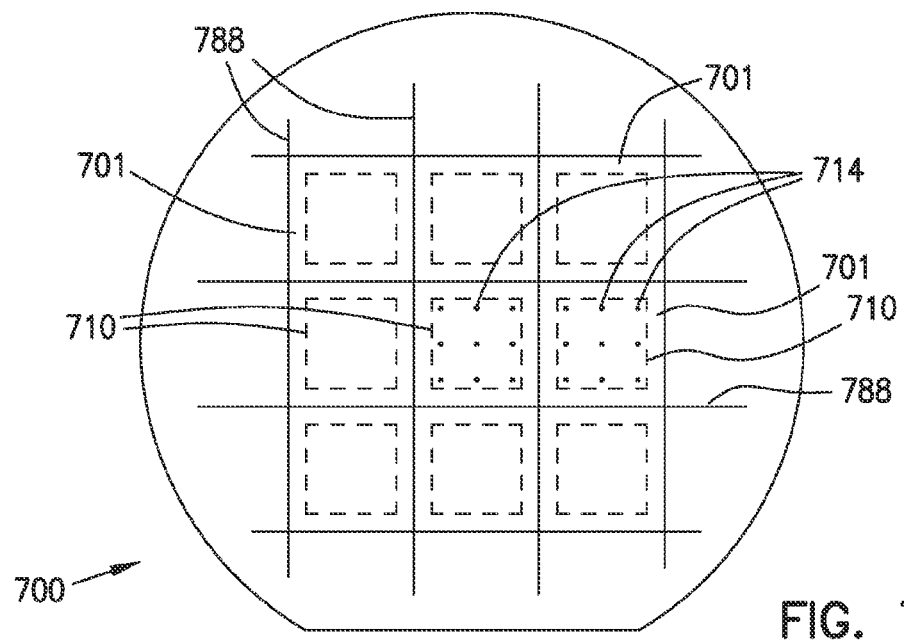
FIG. 7 and FIG. 8 show different views of a wafer with dice having second portions of memory devices according to an embodiment of the invention.
Figure 8:
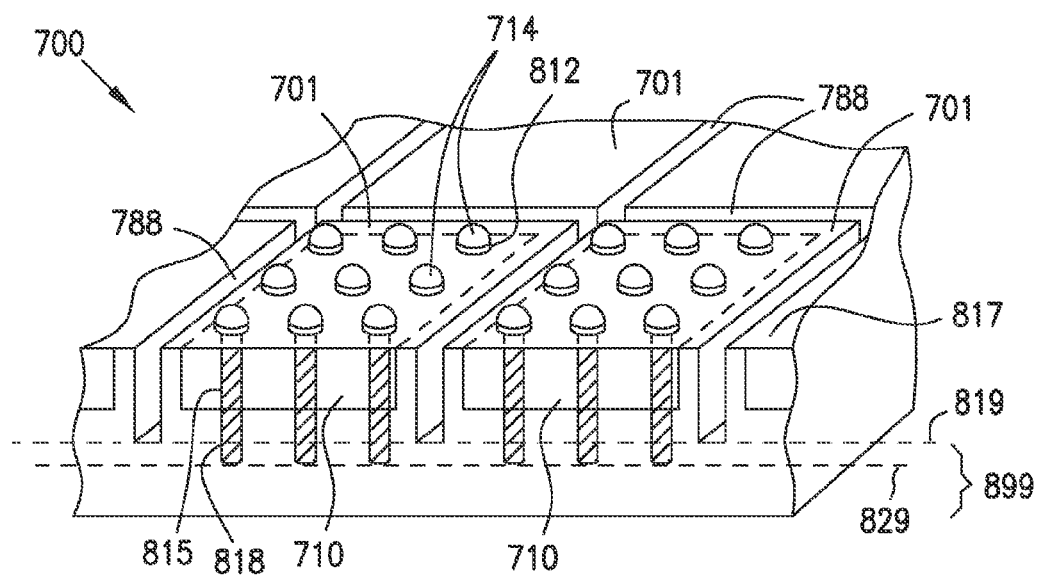

FIG. 7 and FIG. 8 show different views of an embodiment of a wafer 700 with dice having other device portions of memory devices. FIG. 7 shows a plan view of wafer 700. FIG. 8 shows a partial cross section of a part of wafer 700, which may be made from semiconductor material (e.g., silicon). In some embodiments, wafer 700 may include an SOI wafer. As shown in FIG. 7 and FIG. 8, wafer 700 includes a plurality of dice 701, and grooves 788 extending from a surface 817 of wafer 700 to some selected depth 819. As shown in FIG. 8, a wafer portion 899 of wafer 700 holds dice 701 together. Dice 701 may be separated from each other when wafer portion 899 is removed.

Each die 701 of wafer 700 may include one or more circuits 710, conductive paths 815, and bond pads 812. In some embodiments, each die 701 may include adhesive materials, such as the adhesive material 714, on bond pads 812. Circuit 710 may include circuit elements (e.g., memory cells, sense amplifiers, decoders), which are not shown in FIG. 7 and FIG. 8 for clarity. Conductive paths 815 may provide connections and communication to and from circuit 710. In some embodiments, conductive paths 815 may include connections e.g., bit lines 125 of FIG. 1) between memory cells of a memory device and sense amplifiers, or connections between memory cells and decoders (e.g., the word lines 115 of FIG. 1) of the memory device. In FIG. 8, conductive paths 815 extend substantially perpendicularly from surface 817 of wafer 700 through circuit 710 to some selected depth 829. Relative to surface 817, depth 829 may be greater than depth 819. Thus, when wafer portion 899 is removed, end portions 818 of conductive paths 815 may be exposed. Other connections may be coupled to conductive path 815 at exposed end portions 818 so that circuit 710 may communicate with other components through connections from both sides of die 701: one side at end portions 818 and the other side at bond pads 812. Thus, each die 701 may have a conductive path passing through die 701 from one surface (surface 817) to another surface (surface at depth 819 when wafer portion 899 is removed). In some embodiments, conductive paths 815 passing through die 701 of FIG. 8 may be similar to or identical to conductive path 215 passing through die 202 of FIG. 2.

In FIG. 7 and FIG. 8, a portion of a memory device (e.g., memory device 203, 303, or 400) may be formed in each die 701 such that circuit 710 of each die 701 may contain circuit elements of only a portion of the memory device. For example, a device portion containing sense amplifiers, decoders, or both sense amplifiers and decoders of a memory device may be formed in each die 701 of wafer 700. Other dice portions of the memory device (e.g., memory cells) may be formed in another wafer different from wafer 700 (e.g., wafer 500 of FIG. 5).

As described above in reference to FIG. 5 through FIG. 8, each die 501 of wafer 500 or each die 701 of wafer 700 may include only a portion of a memory device (e.g., memory cells, sense amplifiers, decoders, or control unit or a combination of some but not all of these circuit elements). Thus, each die 501 itself or each die 701 itself may contain an incomplete or a non-functional memory device. However, the combination of one die 501 of wafer 500 and one die 701 of wafer 700 may form a complete or a functional memory device. In some embodiments, dice 501 and 701 may have a substantially equal size to improve alignment between dice 501 and 701 when they are combined. In some embodiments, at least one wafer 500 of FIG. 5 and at least one wafer 700 of FIG. 7 may be combined at wafer level in a wafer stack to form a number of complete memory devices.

Figure 9:
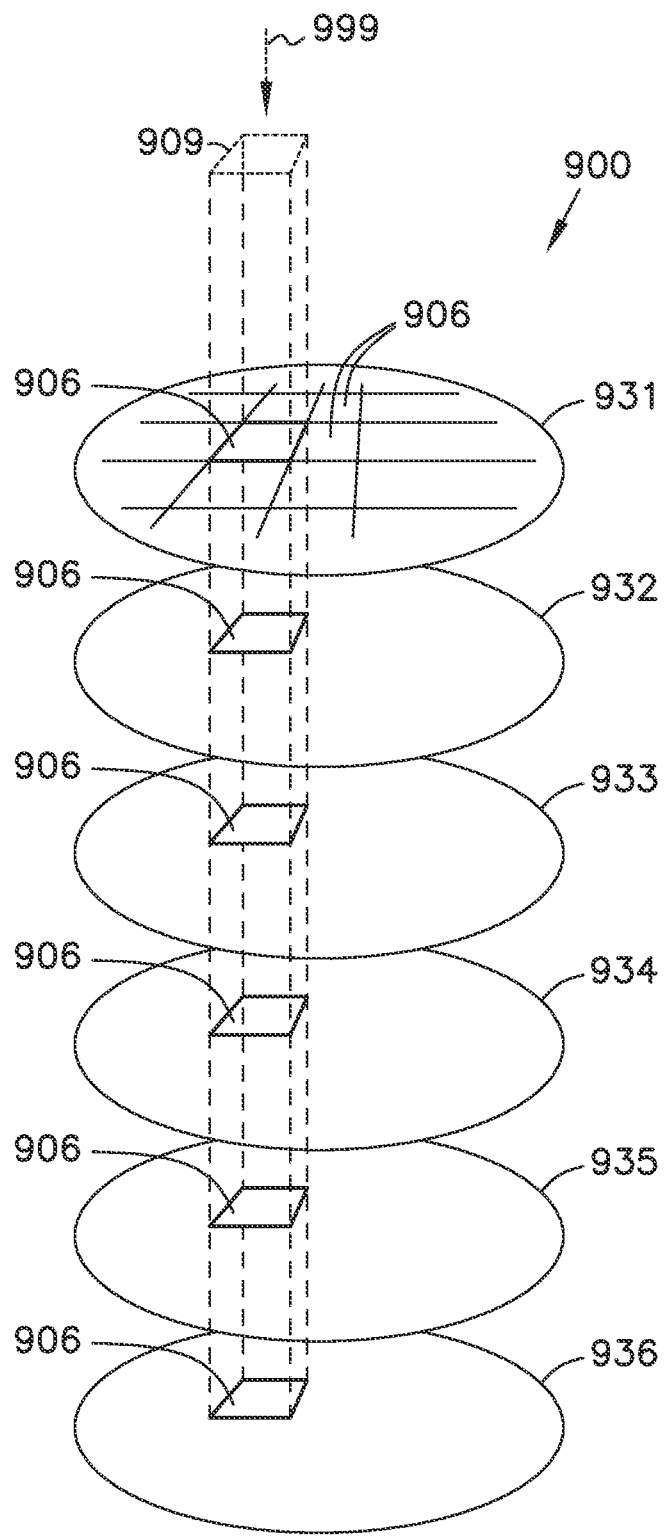
FIG. 9 shows an exploded view of a wafer stack having dice with a substantially equal size.

FIG. 9 shows an exploded view of an embodiment of a wafer stack 900 having dice 906 with substantially the same size. For clarity, in FIG. 9, only wafer 931 is shown with multiple dice 906. Each of wafers 932, 933, 934, 935, and 936 also includes multiple dice. Dice 906 of wafers 931 through 936 have a substantially equal size. The substantially equal size is represented in FIG. 9 as dimension 909, which is determined from a plan view (top view) seen from a direction 999. Dimension 909 may comprise a length dimension, a width dimension, an area dimension, or a sum of the length and widths for an area. Substantially equality in size may allow ease of feature alignment (e.g., bond pads such as bond pads 612 or 812 in FIG. 6 or FIG. 8, respectively) among dice 906 in wafer stack 900 when dice 906 are combined during processes of forming a device, such as memory device 100, 203, 303, and 400 of FIG. 1 through FIG. 4.

FIG. 10 through FIG. 20 show processes of forming a memory device from a wafer stack of two wafers according to various embodiments of the invention.

FIG. 10 shows a cross section of a wafer 1000, having three dice 1001 as an example. Wafer 1000 may have a different number of dice. In some embodiments, wafer 1000 includes embodiments of wafers 500, 700, and wafers 931 through 936 of FIG. 5 through FIG. 9. In FIG. 10, wafer 1000 includes a wafer portion 1099, and a number of grooves 1088 extending from the wafer surface 1017 to a selected depth 1019. In a subsequent process, dice 1001 may be separated from each other when wafer portion 1099 is removed. In some embodiments, wafer portion 1099 may be removed by wafer thinning or by grinding a surface (or back side) 1037 of wafer 1000.

In FIG. 10, each die 1001 may include one or more circuits 1010, conductive paths 1015, bond pads 1012, and adhesive materials 1014. Adhesive materials 1014 may include solder. In some embodiments, bond pads 1012 and adhesive materials 1014 of die 1001 may be formed using techniques described in U.S. Pat. Nos. 6,136,689 and 6,958,287, incorporated herein by reference in their entirety.

Circuit 1010 may include a portion of a memory device (e.g., similar to or identical to device portion 101 with memory cells 121 of memory device 100 of FIG. 1) such that circuit 1010 is configured to perform only a portion of a function of a memory device. For example, circuit 1010 may include at least one but fewer than all of the following: memory cells and associated word lines and bit lines, a decoder, a sense amplifier, a control unit, input/output unit, and other circuitry of a memory device. Thus, in some embodiments, circuit 1010 of die 1001 may include memory cells and associated word lines and bit lines of a memory device without additional circuitry (e.g., without a decoder, a sense amplifier, or both) of the memory device. The additional circuitry of the memory device may be formed in another die of another wafer or in multiple dice of multiple wafers.

FIG. 11 shows a partial cross section of a wafer 1100 including three dice 1102 as an example. Wafer 1100 may have a different number of dice. In some embodiments, wafer 1100 includes embodiments of wafers 500, 700, and wafers 931 through 936 of FIG. 5 through FIG. 9. In FIG. 11, wafer 1100 includes a wafer portion 1199, which holds dice 1102 together, and grooves 1188 extending from wafer surface 1117 to a selected depth 1119. Dice 1102 may be separated from each other when wafer portion 1199 is removed. In some embodiments, wafer portion 1199 may be removed by grinding a surface (or back side) 1137 of wafer 1100.

In FIG. 11, each die 1102 may include one or more circuits 1110, bond pads 1112, and conductive paths 1115. Each conductive path 1115 may be coupled to one bond pad 1112, so as to extend from wafer surface 1117 to a selected depth 1129. Each conductive path 1115 may include an end portion 1118, which may be exposed when wafer portion 1199 is removed. In some embodiments, conductive paths 1115 may be formed using techniques described in U.S. Pat. No. 5,202, 754; 5,892,288; and 6,507,117; each of which is incorporated herein by reference in its entirety. FIG. 11 shows bond pads 1112 without adhesive materials (e.g., solder). In some embodiments, adhesive materials may also be formed on bond pads 1112.

In FIG. 11, the circuits 1110 may include a portion of a memory device (e.g., similar to or identical to the portion 103 of memory device 100 of FIG. 1) such that circuit 1110 is configured to perform only a portion of a function of the memory device. For example, circuit 1110 may include at least one but fewer than all of the following: memory cells and associated word lines and bit lines, a decoder, a sense amplifier, a control unit, input/output unit, and other circuitry for a memory device. Thus, in some embodiments, circuit 1110 of die 1102 may include at least one of a decoder, a sense amplifier, a control unit, input/output unit, and other circuitry for a memory device without additional circuitry (e.g., without memory cells and associated word lines and bit lines) of the memory device. The additional circuitry of the memory device may be formed in another die of another wafer (e.g., wafer 1000 of FIG. 10) or in multiple dice of multiple wafers.

FIG. 12 shows wafer 1100 of FIG. 11 being contacted or combined with wafer 1000 such that bond pads 1112 of wafer 1100 are substantially aligned and in contact with corresponding bond pads 1012 of wafer 1000. FIG. 12 shows wafer 1100 being placed on wafer 1000 as an example. In some embodiments, wafer 1000 may be placed on wafer 1100.

FIG. 13 shows wafers 1000 and 1100 after a bonding process has been performed. In some embodiments, wafers 1000 and 1100 may be put through a bonding process to cause adhesive materials 1014 to couple bond pads 1012 to bond pads 1112 to form a number of joints 1338 between dice 1001 and dice 1102. In some embodiments, adhesive materials 1014 may include solder such that wafers 1000 and 1100 may be put through a solder reflow process to cause the solder to melt and then solidify such that joints 1338 comprise solder joints. The solder reflow process may be a C4 (controlled collapsed chip connection) process. Thus, in some embodiments, joints 1338 comprise C4 solder joints. It should be noted that joints 238 of FIG. 2, joints 338 of FIG. 3, joints 1338 of FIG. 13, and all similarly and subsequently described joints herein may comprise electrically conductive joints.

FIG. 13, each die 1001 of wafer 1000 and each die 1102 of wafer 1100 may form a die combination such as die combinations 1381, 1382, or 1383. FIG. 13 shows die combinations 1381, 1382, and 1383 being held together by wafer portions 1099 and 1199. In a subsequent process, die combinations 1381, 1382, and 1383 may be separated from each other into single die combinations when wafer portions 1099 and 1199 are removed. In some embodiments, any one or more of die combinations 1381, 1382, and 1383, after being separated from each other, may form a functional memory device similar to or identical to memory device 203 of FIG. 2 or memory device 303 of FIG. 3.

FIG. 14 shows the wafer 1100 after wafer portion 1199 (see FIG. 13) of the wafer 1100 is removed. In FIG. 14, dice 1102 are separated from each other but remain bonded to dice 1001 of wafer 1000. End portion 1118 of each conductive path 1115 may be exposed on die surface 1418 of each die 1102.

FIG. 15 shows dice 1102 with bond pads 1512 and adhesive materials 1514 formed over end portions 1118 of conductive paths 1115.

Figure 16:
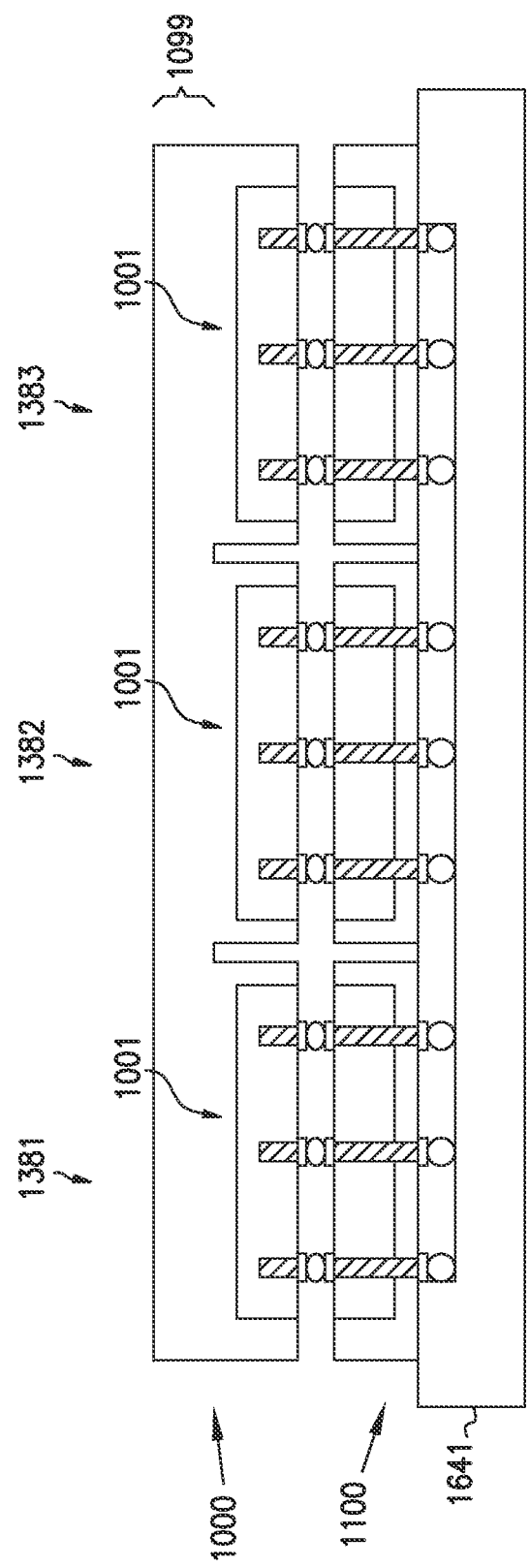

FIG. 16 shows a holder 1641 coupled to wafer 1100. Holder 1641 may be used to temporarily hold die combinations 1381, 1382, and 1383 so that wafer portion 1099 of wafer 1000 may be removed to separate dice 1001 from each other.

Figure 17:
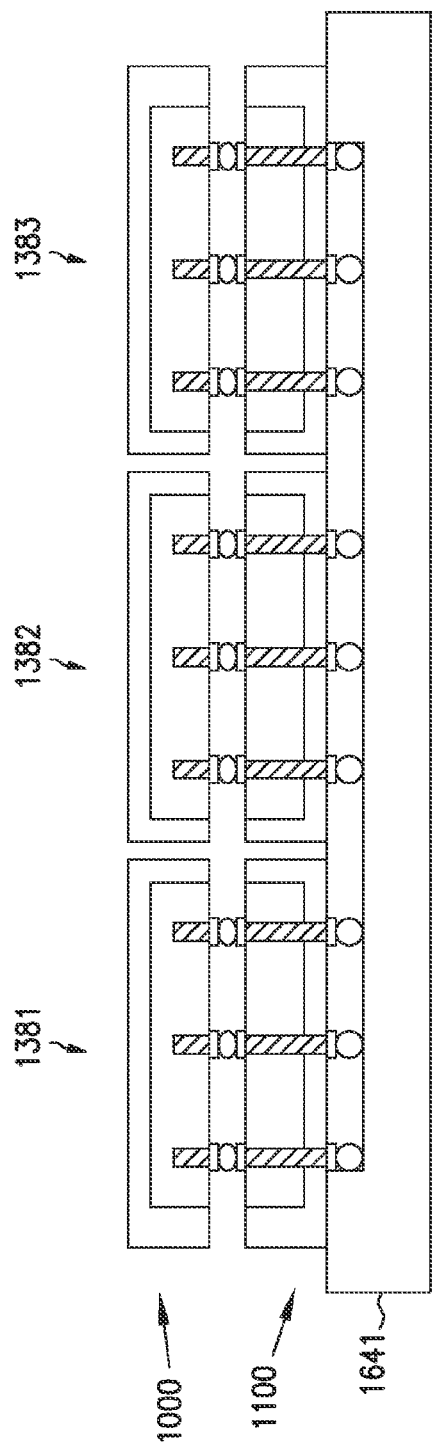

FIG. 17 shows die combinations 1381, 1382, and 1383 being separated from each other after wafer portion 1099 of wafer 1000 (see FIG. 16) is removed.

Figure 18:
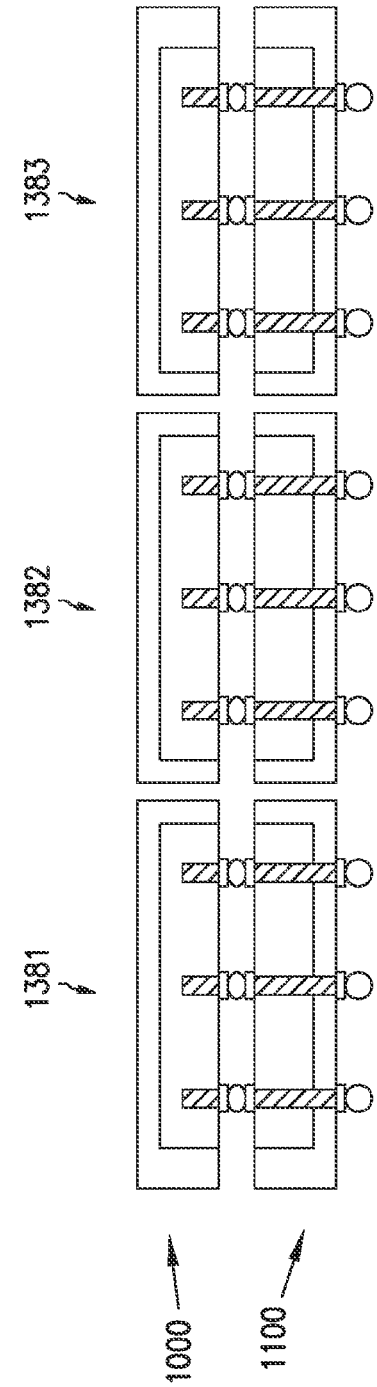

FIG. 18 shows die combinations 1381, 1382, and 1383 after holder 1641 (see FIG. 16) is removed. Each of die combinations 1381, 1382, and 1383 may form an individual, functional memory device. Packaging processes may be performed to enclose each of die combinations 1381, 1382, and 1383 in an IC package, similar to or identical to an IC package 200 (FIG. 2), an IC package 300 (FIG. 3), or other types of IC packages. In some embodiments, testing of die combinations 1381, 1382, and 1383 may be performed at the wafer level (e.g. during the processes corresponding to FIG. 16 or FIG. 17) or at the device level (e.g., during or after the processes corresponding to FIG. 18).

FIG. 19 shows a die 1902 being removed from a die combination. Die combinations 1981, 1982, and 1983 of FIG. 19 may include embodiments of die combinations 1381, 1382, and 1383 that arise during the implementation of the processes described in reference to FIG. 10 through FIG. 18. In FIG. 19, the die 1902 is removed from die combination 1983 so that a non-defective die (i.e., a good die) may replace die 1902 determined to be defective, perhaps during a testing process.

Testing of die 1902 may be performed before or after die 1902 is bonded to dice 1901 of wafer 1900. For example, die 1902 may be tested while it is on wafer 1950, before wafer 1950 is bonded to wafer 1900. During the testing of die 1902, the location identification (ID), such as X-Y coordinates, of die 1902 may be recorded when die 1902 is determined to be defective. In FIG. 19, based on the recorded ID, die 1902 may be located, removed, and replaced after wafer 1950 is bonded to wafer 1900. In some embodiments, removing die 1902 may involve a technique described in U.S. Pat. No. 4,923,521, hereinafter incorporated by reference in its entirety.

In some embodiments, adhesive materials 1914 may be omitted from die 1901 during the processes of forming die combinations 1981, 1982, and 1983 when a corresponding die such as die 1902 is previously determined or known to be defective. By refraining from adding the adhesive material to, or omitting the adhesive material from die 1901, a defective die such as die 1902 may not be bonded to die 1901 when die combinations 1981, 1982, and 1983 are formed, thereby simplifying removal of a defective die such as die 1902 from die combination 1983.

In some embodiments, die 1902 may include redundancy circuit elements for replacing defective circuit elements. During testing, the redundancy circuit elements in die 1902 may be used to replace defective circuit elements, repairing defective die 1902 such that defective die 1902 may become a good die, perhaps obviating removal of die 1902 from die combination 1983. In some embodiments, even if die 1902 is defective, the removal of die 1902 from die combination 1983 may be omitted. In addition, or alternatively, die combination 1983 that contains defective die 1902 may be determined to be defective (perhaps due to the existence of defective die 1902, or for other reasons) and may be discarded after die combination 1983 is separated from die combinations 1981 and 1982.

FIG. 20 shows a non-defective die 2002 that is used to replace defective die 1902 (see FIG. 19). In FIG. 20, die 2002 may be bonded to die 1901 by implementing a selected bonding process. In some embodiments, to reduce thermal effects on the connections of non-defective die combinations 1981 and 1982, a localized reflow process may be preformed such that only a selected area in the proximity of die combination 1983 is heated to a temperature higher than the areas proximate to non-defective die combinations 1981 and 1982. After the replacement of the defective die in FIG. 20, die combinations 1981, 1982, and 1983 may then be separated from each other by processes similar to that described in reference to FIG. 15 through FIG. 18.

FIG. 10 through FIG. 20 show processes of forming a memory device from a wafer stack of two wafers as an example. In some embodiments, a memory device may be formed from a water stack of more than two wafers using processes similar to or identical to the processes described in reference to FIG. 10 through FIG. 20.

Figure 21:
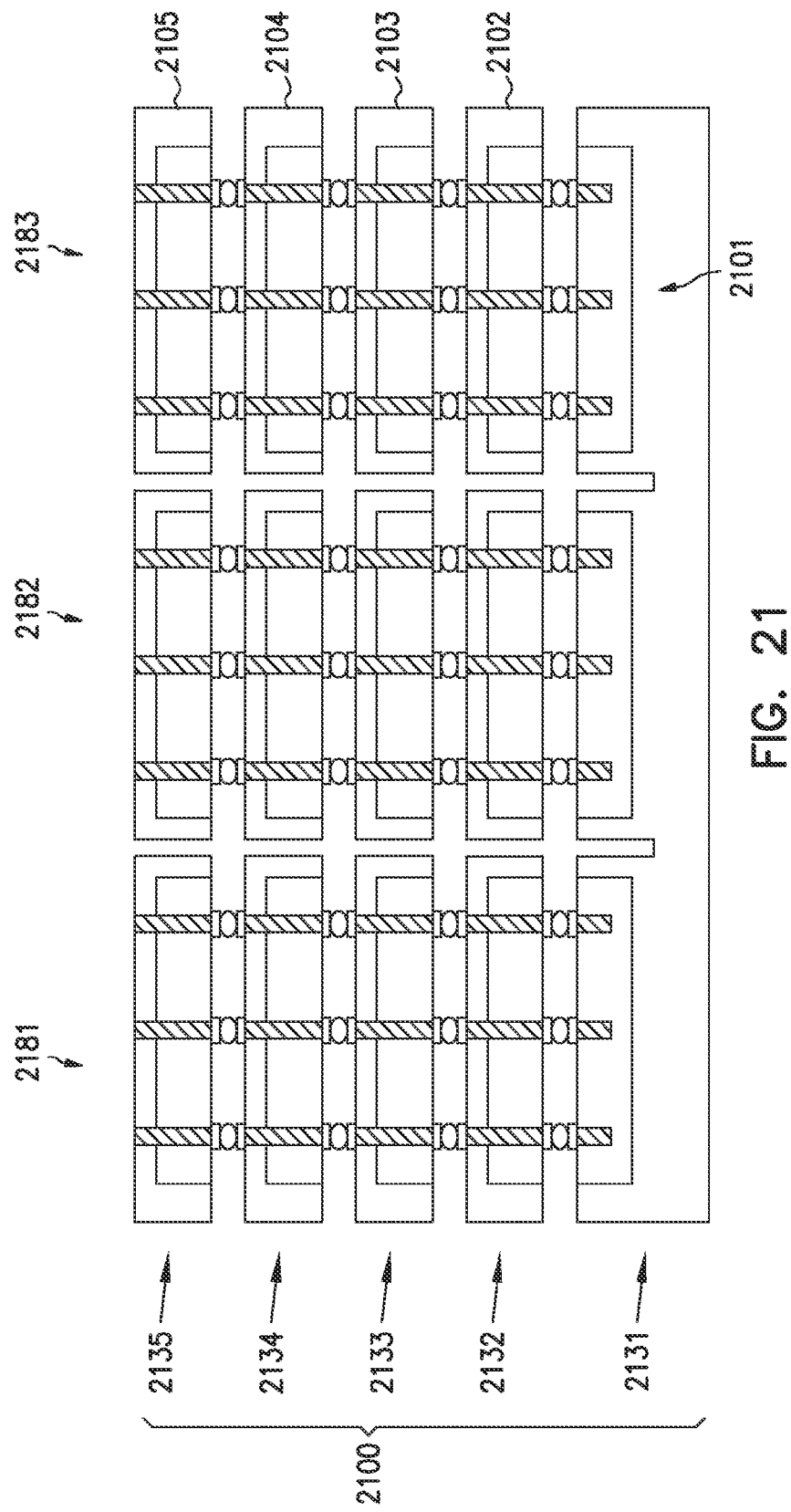
FIG. 21 and FIG. 22 show processes of forming a memory device from a wafer stack of more than two wafers according to an embodiment of the invention.
Figure 22:
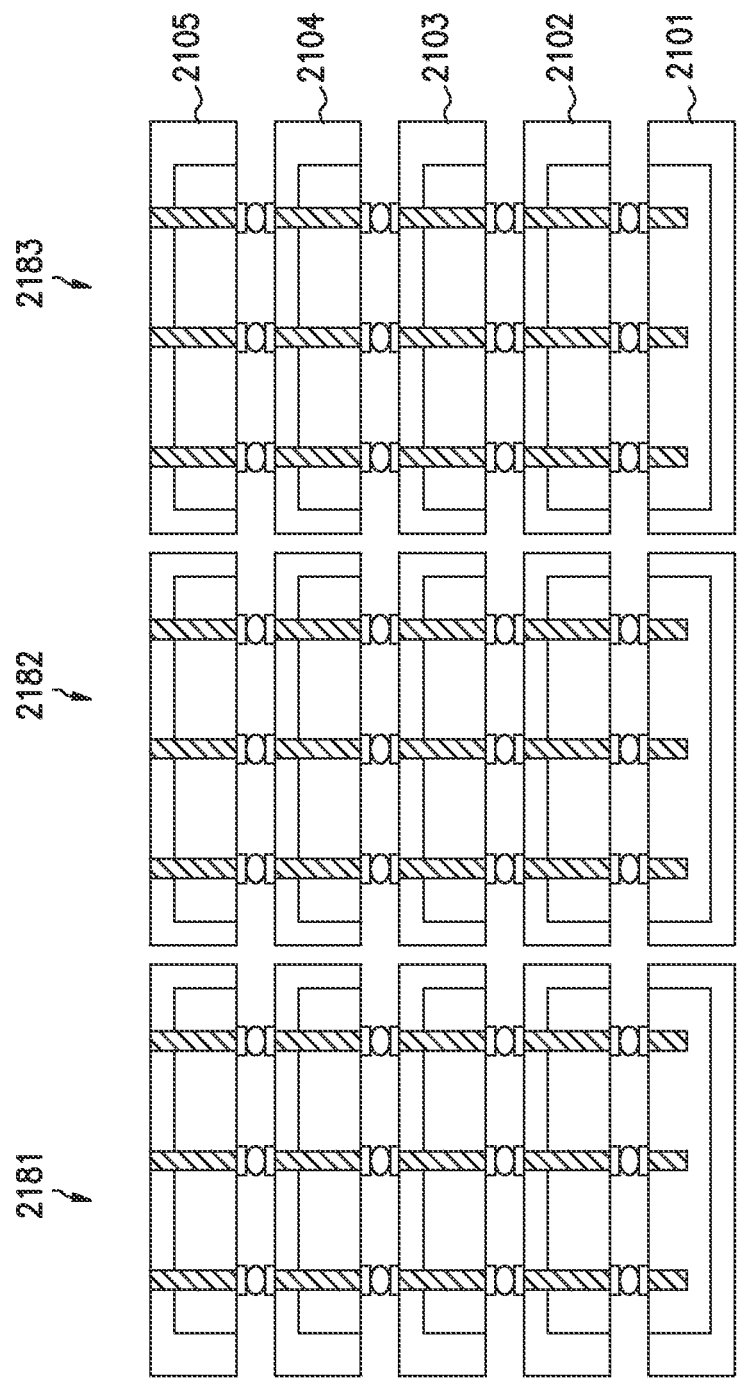

FIG. 21 and FIG. 22 show processes of forming a memory device from a wafer stack of more than two wafers. FIG. 21 shows an example of a wafer stack 2100 having five wafers 2131, 2132, 2133, 2134, and 2135. In some embodiments, wafer stack 2100 may have a different number of wafers. FIG. 21 shows dice 2101, 2102, 2103, 2104, and 2105 have a substantial equal size. In some embodiments, the size and shape of dice 2101, 2102, 2013, 2104, and 2105 may be different among each other. In FIG. 21, dice 2101, 2102, 2013, 2104, and 2105 of die combinations 2181, 2182, and 2183 may be formed using processes similar to or identical to those described in reference to FIG. 10 through FIG. 20. For example, after wafers 2131 and 2132 are bonded to each other, wafer 2133 may be bonded to wafer 2132, then wafer 2134 may be bonded to wafer 2133, and then wafer 2135 may be bonded to wafer 2134.

FIG. 22 shows die combinations 2181, 2182, and 2183 of FIG. 21 after they have been separated. Each of die combinations 2181, 2182, and 2183 may form a separate, functional memory device in which each of dice 2101 through 2105 may form a portion of the individual memory devices. For example, in each of die combinations 2181, 2182, and 2183, memory cells of the memory device may be formed in only dice 2101, 2102, and 2103 and the rest of the circuitry of the respective memory devices may be formed in dice 2104 and 2105. Packaging processes may be performed to enclose each of combinations 2181, 2182, and 2183 in one or more IC packages, similar to or identical to IC package 200 (FIG. 2), IC package 300 (FIG. 3), or other types of IC packages.

Figure 23:
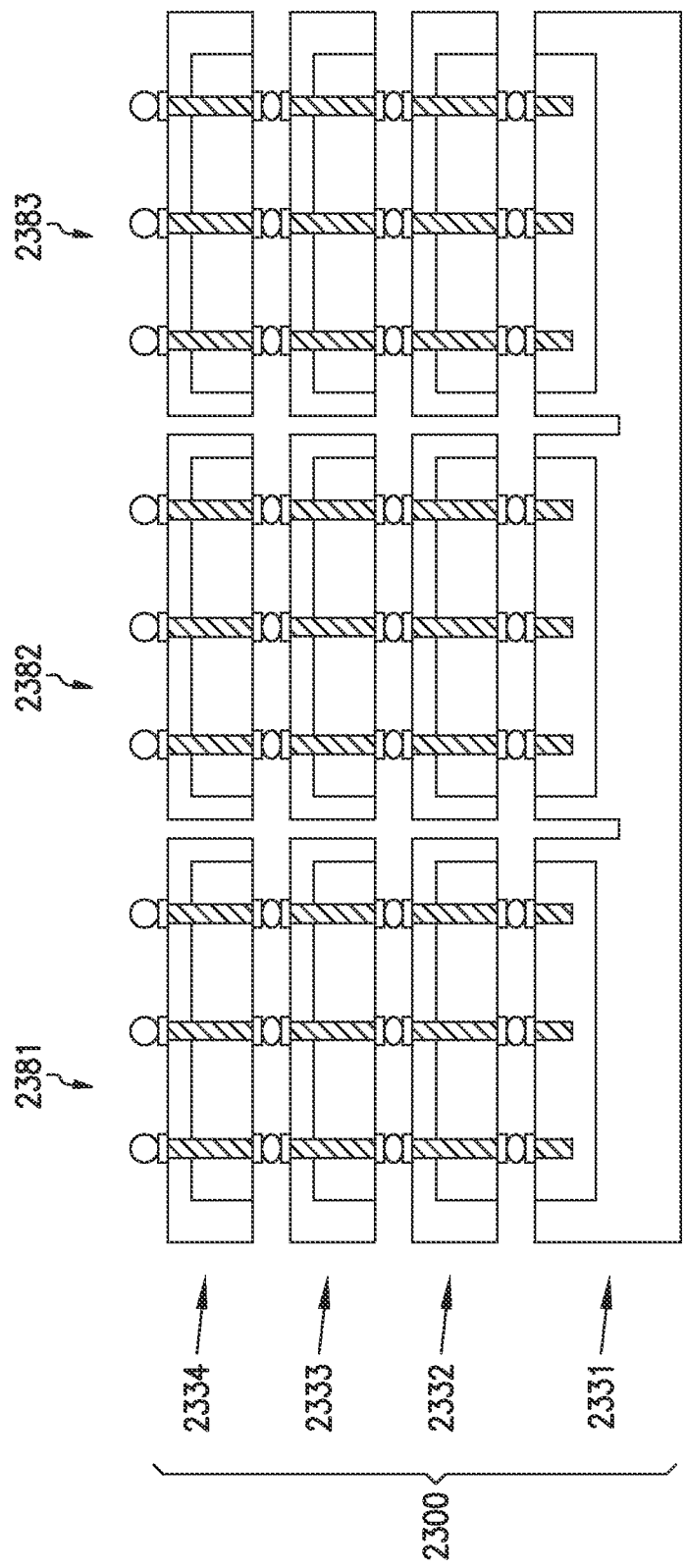
FIG. 23 through FIG. 26 show processes of forming a memory device from multiple wafer stacks according to an embodiment of the invention.
Figure 24:
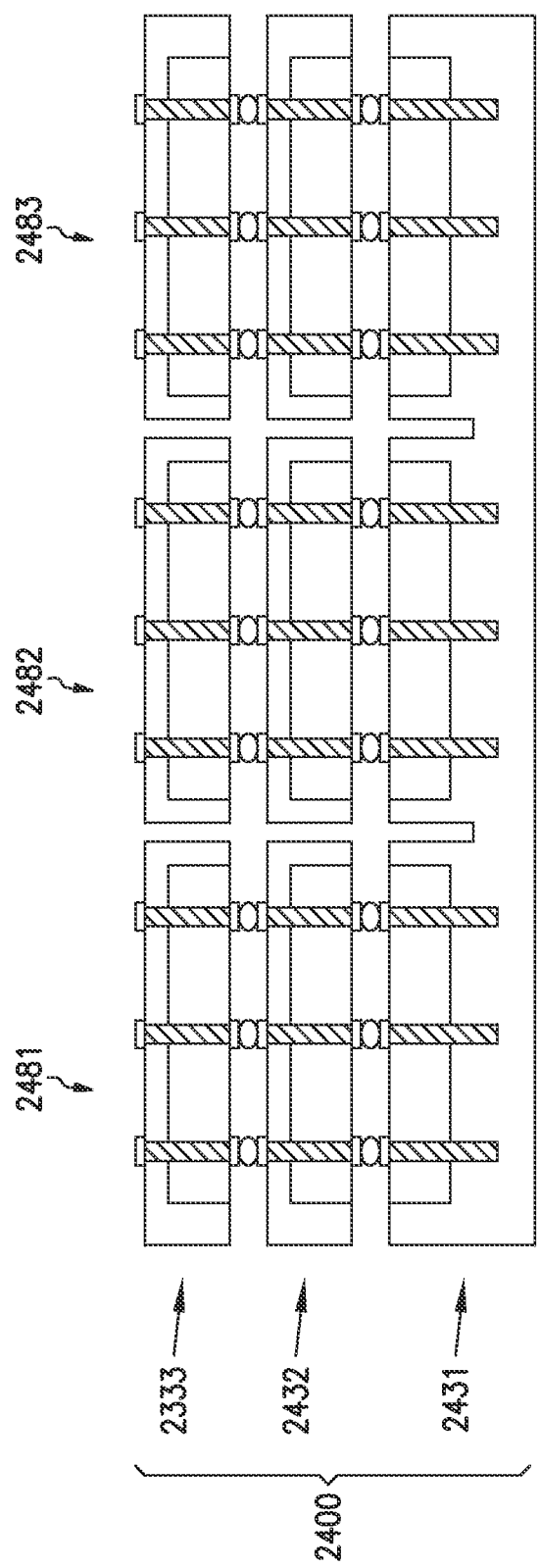

FIG. 23 through FIG. 26 show processes of forming a memory device from multiple wafer stacks. In FIG. 23 a first wafer stack 2300 includes wafers 2331, 2332, 2333, and 2334 with die combinations 2381, 2382, and 2383. In FIG. 24 a second wafer stack 2400 includes wafers 2431, 2432, and 2433 with die combinations 2481, 2482, and 2483. Die combinations in each of wafer stacks 2300 and 2400 may be formed using processes similar to or identical to those described in FIG. 10 through FIG. 22.

Figure 25:
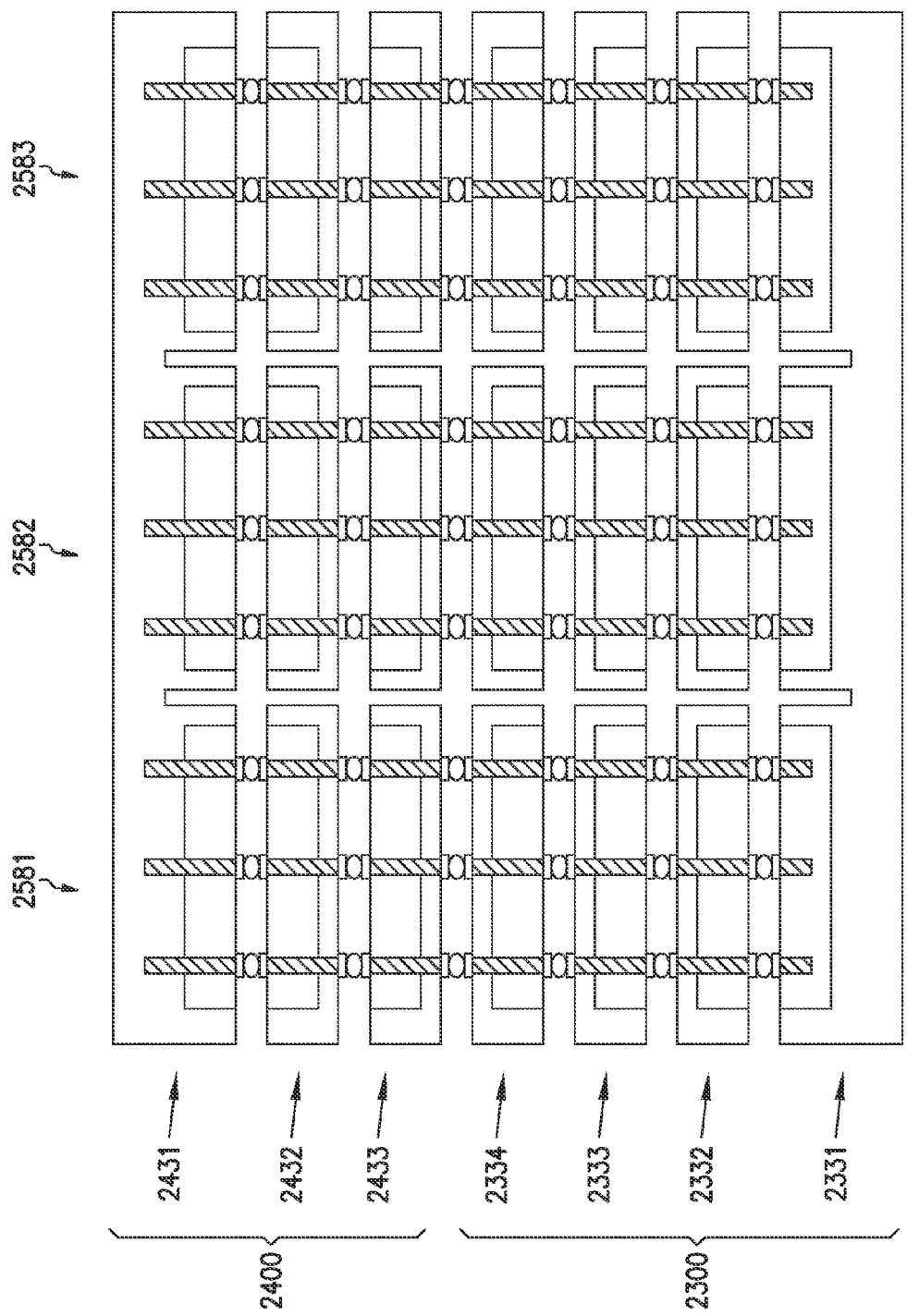

FIG. 25 shows wafer stack 2300 of FIG. 23 and wafer stack 2400 of FIG. 24 being bonded together to produce die combinations 2581, 2582, and 2583.

Figure 26:
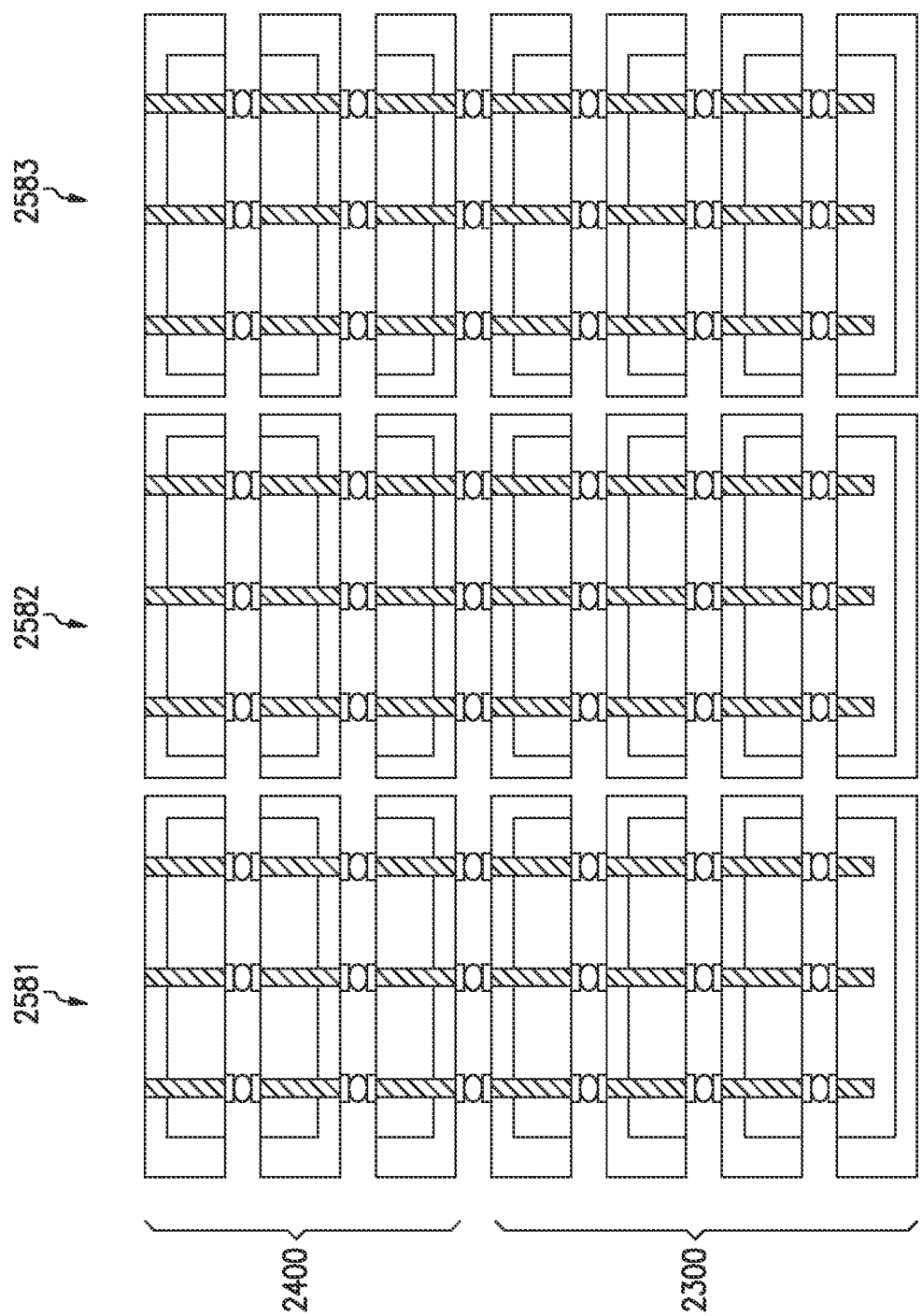

FIG. 26 shows die combinations 2581, 2582, and 2583 after they have been separated from each other. Each of die combinations 2581, 2582, and 2583 may include one of the die combinations of wafer stack 2300 and one of the die combinations of wafer stack 2400. Each of die combinations 2581, 2582, and 2583 may form a separate, functional memory device. Packaging processes may be performed to enclose each of combinations 2581, 2582, and 2583 in one or more IC packages, similar to or identical to IC package 200 (FIG. 2), IC package 300 (FIG. 3), or other types of IC packages.

Figure 27:
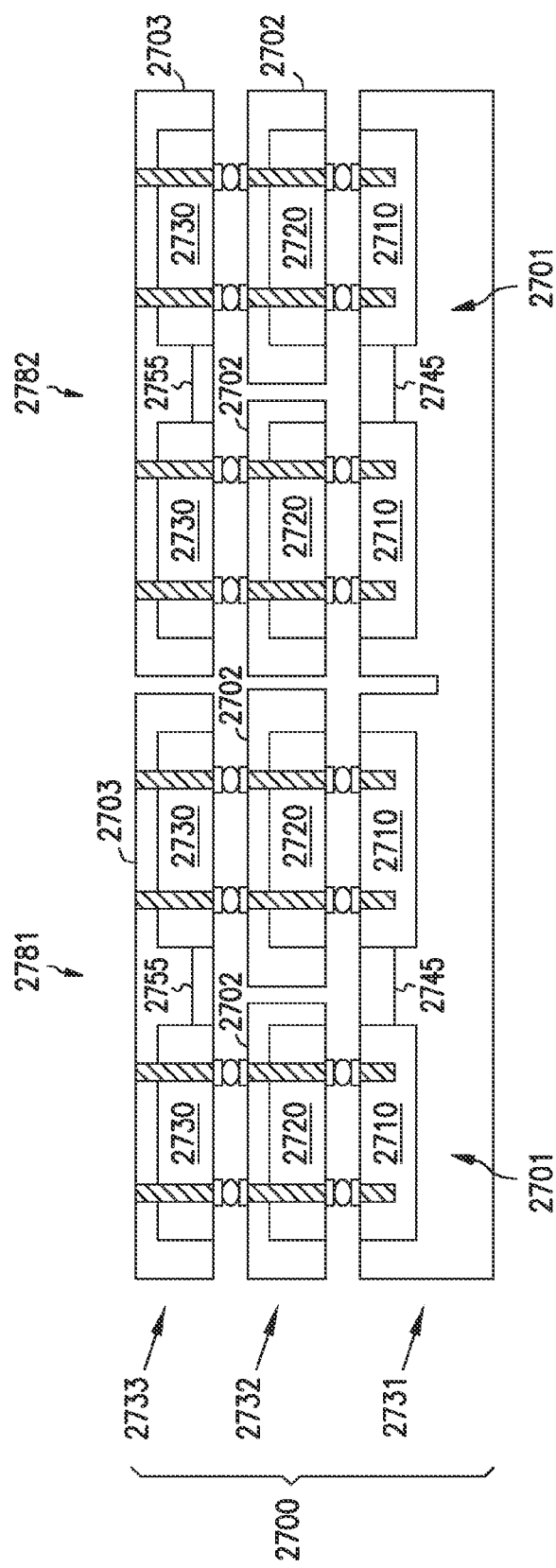
FIGS. 27 and 28 show processes of forming a device from a wafer stack in which at least one wafer of the wafer stack includes multiple circuits in each die according to an embodiment of the invention.
Figure 28:
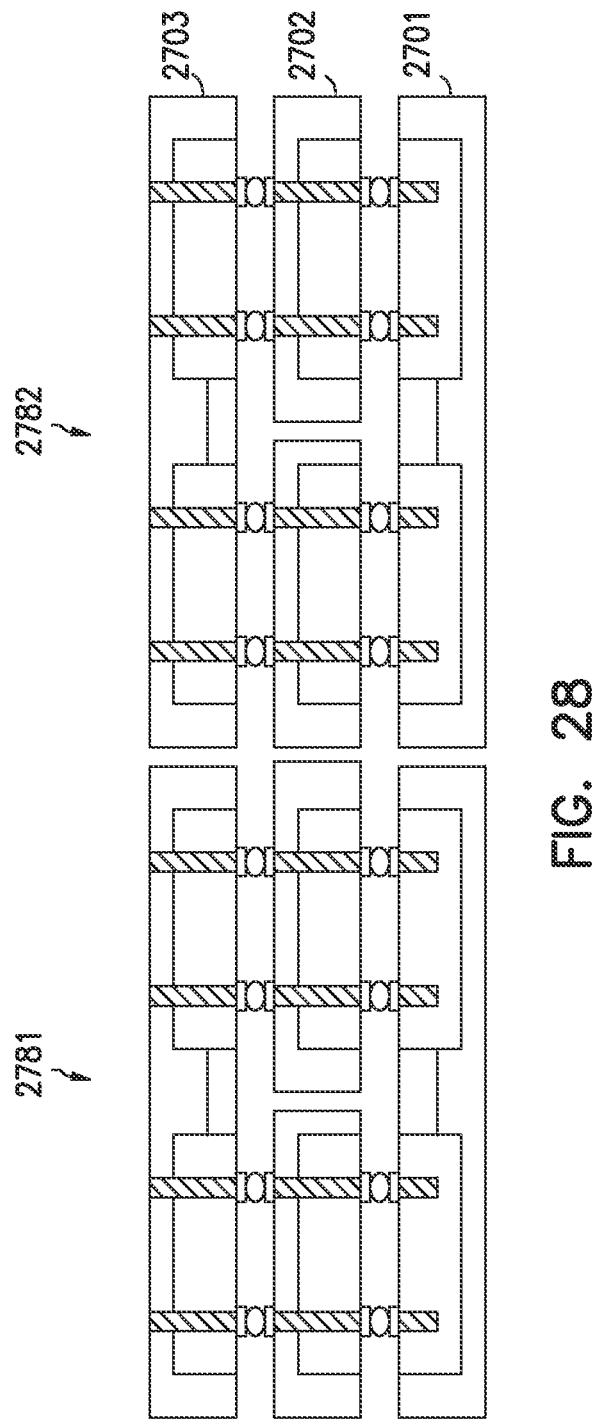

FIG. 27 and FIG. 28 show processes of forming a device from a wafer stack 2700 in which at least one wafer of wafer stack 2700 includes multiple circuits in each die. FIG. 27 shows an example of wafer stack 2700 having three wafers 2731, 2732, and 2733. In some embodiments, wafer stack 2700 may have a different number of wafers. In FIG. 27, dice 2701, 2702, and 2703 of die combinations 2781 and 2782 may be formed using processes similar to those described in reference to FIG. 10 through FIG. 26. In FIG. 27 each die 2701 of wafer 2731 may include two circuits 2710. In wafer 2732, each die 2702 may include one circuit 2720. In wafer 2733, each die 2703 may include two circuits 2730.

A link (e.g., link 2745 or 2755) may be formed to allow the circuits within dice 2701 and 2703 to communicate with each other. FIG. 27 shows each die 2701 being coupled to a pair of dice 2702. In some embodiments, wafer stack 2700 may have other arrangements different from that shown in FIG. 27. For example, the pair of dice 2702 in FIG. 27 may be combined into a single die such as die 2701. For another example, each die 2703 linked by the link 2755 may be separated to form a pair of separated dice, such as dice 2702. Other combinations, including three and more dice linked together are possible.

FIG. 28 shows die combinations 2781 and 2782 of FIG. 27 after they have been separated from each other. Each of die combinations 2781 and 2782 may form a functional device in which each of dice 2701, 2702 and 2703 may form a portion of the device that is non-functional without being coupled to the other portions.

In some embodiments, each of die combinations 2781 and 2782 of FIG. 28 may form a memory device such that memory cells of the memory device may be formed in at least one but fewer than all of dice 2701, 2702, and 2703 and the rest of the circuitry of the memory device may be formed in the rest of dice 2701, 2702, and 2703.

In other embodiments, each of die combinations 2781 and 2782 of FIG. 28 may form a processor with single or multiple processing cores (i.e., a multiple-core processor) such that logic circuitry of the processor may be formed in at least one but fewer than all of dice 2701, 2702, and 2703 and the rest of the circuitry of the processor may be formed in the rest of dice 2701, 2702, and 2703. For example, each of the multiple processing cores of the processor may be formed in one of dice 2701 and other circuitry of the processor may be formed in one or more of dice 2702 and 2703.

In some embodiments, each of die combinations 2781 and 2782 of FIG. 28 may form a system on a chip such that one or more processor logic circuitry sections (e.g., one or more processing cores) for a processor may be formed in at least one but fewer than all dice 2701, 2702, and 2703. One or more memory devices (e.g., DRAM, SRAM cache, or both) may be formed in dice 2701, 2702, and 2703 that are separated from the die or dice where the logic circuitry of the processor is formed.

FIG. 28 shows each of die combinations 2781 and 2782 in an unpackaged form. Packaging processes may be performed to enclose each of die combinations 2781 and 2782 in one or more IC packages.

Figure 29:
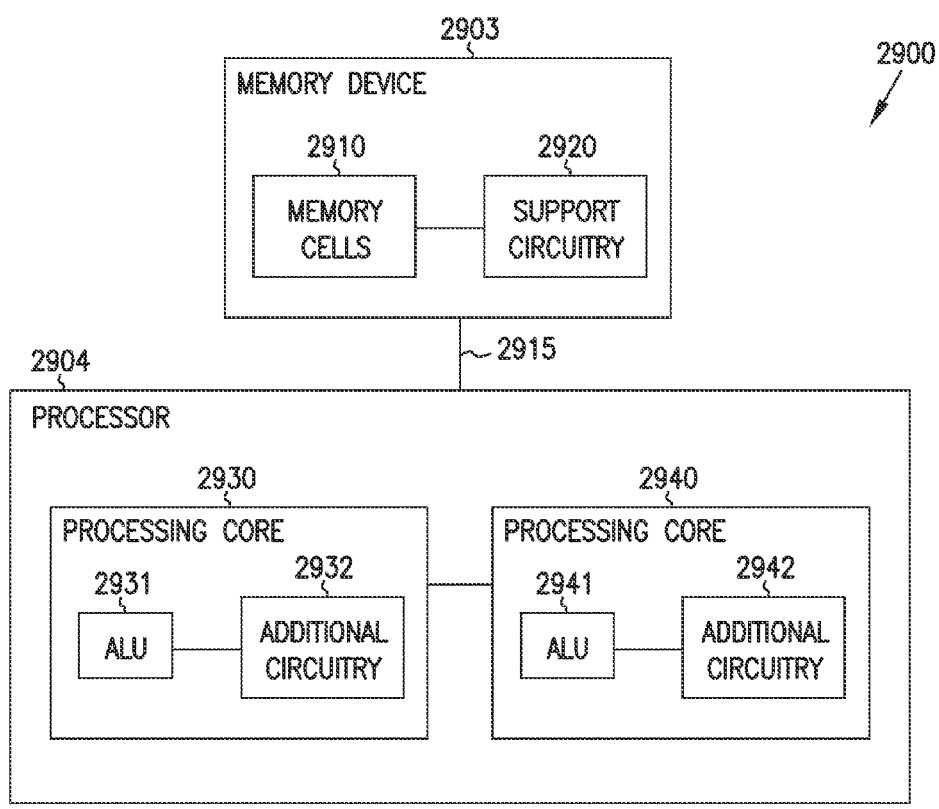
FIG. 29 is a block diagram of an IC package having a memory device and a processor according to an embodiment of the invention.

FIG. 29 shows a block diagram of an IC package 2900. IC package 2900 includes a memory device 2903, a processor 2904, and a connection 2915. Memory device 2903 may include memory cells 2910 and support circuitry 2920. Processor 2904 may include multiple processing cores 2930 and 2940. Thus, processor 2904 may comprise a multiple-core processor. Processing core 2930 may include an arithmetic logic unit (ALU) 2931 and additional circuitry 2932. Processing core 2940 may also include an ALU 2941 and additional circuitry 2942. ALU 2931 and ALU 2941 may perform mathematic functions such as addition and subtraction. Additional circuitry 2932 and 2942 may perform other tasks of processor 2904. In some embodiments, processor 2904 may omit one of cores 2930 and 2940 such that processor 2904 may comprise a single core processor. In other embodiments, IC package 2900 may omit memory device 2903 and processor 2904 may be formed in multiple dice in which device portions (e.g., logic circuitry) of processor 2904 may be distributed among the multiple dice such that one of the dice may include ALU 2931, and another die may include ALU 2941.

In some embodiments, the circuitry included in IC package 2900 may be formed in two or more separate dice. For example, memory cells 2910, and support circuitry 2920 may be formed on two or more separate dice, and processing cores 2930 and 2940 may be formed in at least one die. IC package 2900 may include or implement any of the embodiments described above in reference to FIG. 2 through FIG. 28.

Figure 30:
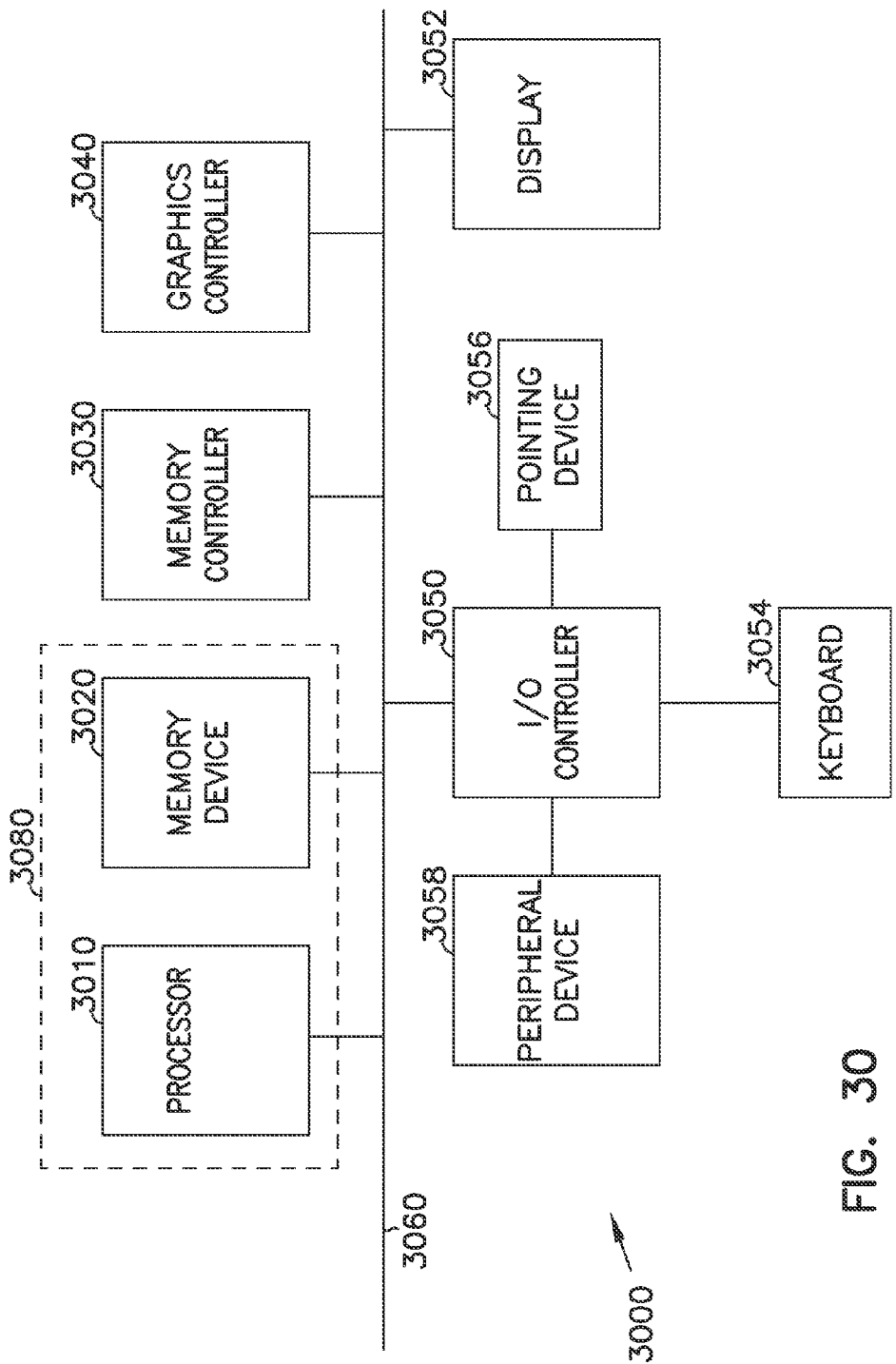
FIG. 30 is a block diagram of a system according an embodiment of the invention.

FIG. 30 shows a block diagram of a system 3000 according to an embodiment of the invention. System 3000 may include one or more processors 3010, memory devices 3020, memory controllers 3030, graphics controllers 3040, input and output (I/O) controllers 3050, displays 3052, keyboards 3054, pointing devices 3056, peripheral devices 3058, and buses 3060.

Processor 3010 may comprise a general-purpose processor or an application specific integrated circuit (ASIC), which may include a single-core processor or a multiple-core processor. Memory device 3020 may comprise a DRAM device, an SRAM device, a flash memory device, or a combination of these memory devices. The I/O controller 3050 may include a communication module for wired or wireless communication.

One or more of the components shown in system 3000 may be included in a single IC package. FIG. 30 shows an example where two components, processor 3010 and memory device 3020, may be included in a single IC package such as IC package 3080. Any one or more or the components shown in system 3000 may include embodiments of FIG. 1 through FIG. 29.

System 3000 may include computers (e.g., desktops, laptops, hand-helds, servers, web appliances, routers, etc.), wireless communication devices (e.g., cellular phones, cordless phones, pagers, personal digital assistants, etc.), computerrelated peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

The above description and the drawings illustrate some example embodiments of the invention. Other embodiments may incorporate structural, logical, electrical, process, and other changes. In the drawings, like features or like numerals describe substantially similar features. Examples merely show possible variations. Portions and features of some embodiments may be included in, or substituted for, those of others. Many other embodiments will be apparent to those of skill in the art upon reading and understanding the above description. Therefore, the scope of various embodiments of the present disclosure is determined by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A method comprising:
   forming on each die of a plurality of dice of a first wafer a plurality of memory cells of a device; and
   forming on each die of the plurality of dice a plurality of word lines and bit lines for accessing the memory cells, wherein the memory cells, the word lines, and the bit lines are formed for combining with at least one of a decoder, a sense amplifier, and a control unit of the device, wherein at least one of the decoder, the sense amplifier, and the control unit of the device is formed in a die of a second wafer, wherein the word lines and bit lines are part of conductive paths, the conductive paths are formed such that the conductive paths extend from a surface of the first wafer to a depth in the first wafer, each of the conductive paths includes an end portion in the first wafer, and the end portion is exposed when a portion of the first wafer is removed.

2. The method of claim 1 further comprising:
   forming a plurality of grooves between the plurality of dice.

3. The method of claim 1, wherein forming the word lines includes forming at least a portion of each of the word lines to be substantially perpendicular to a surface of the first wafer.

4. The method of claim 3, wherein forming the bit lines includes forming at least a portion of each of the bit lines to be substantially perpendicular to a surface of the first wafer.

5. The method of claim 4 further comprising:
   forming a plurality of bond pads coupled to the word lines and the bit lines.

6. A method comprising:
   forming on each die of a plurality of dice of a first wafer at least one of a decoder, a sense amplifier, and a control unit of a device; and
   forming on each die of the plurality of dice a plurality of conductive paths, wherein at least one of the decoder, the sense amplifier, and the control unit and the conductive paths are formed for combining with a plurality of memory cells of the device, wherein the memory cells are formed in a die of a second wafer, wherein the conductive paths are formed such that the conductive paths extend from a surface of the first wafer to a depth in the first wafer, each of the conductive paths includes an end portion in the first wafer, and the end portion is exposed when a portion of the first wafer is removed.

7. The method of claim 6, further comprising:
   forming a plurality of grooves between the plurality of dice.

8. The method of claim 6, wherein forming the conductive paths includes forming at least a portion of each of the conductive paths to be substantially perpendicular to a surface of the first wafer.

9. The method of claim 8, further comprising:
   forming a plurality of bond pads coupled to the conductive paths.

10. A method comprising:
    contacting a first wafer to a second wafer, wherein the first wafer includes a plurality of first dice and conductive paths, wherein the conductive paths are formed such that the conductive paths extend from a surface of the first wafer to a depth in the first wafer, each of the conductive paths includes an end portion in the first wafer, and the end portion is exposed when a portion of the first wafer is removed, each die of the plurality of first dice including a first device portion of a memory device, the first device portion including fewer than all of a plurality of memory cells, a decoder, a sense amplifier, and a control unit of the memory device, and wherein the second wafer includes a plurality of second dice, each die of the plurality of second dice including a second device portion of the memory device; and
    bonding the first wafer to the second wafer.

11. The method of claim 10, wherein bonding includes soldering a plurality of the first bond pads of each of the first dice to a plurality of the second bond pads of one of the second dice.

12. The method of claim 10, wherein bonding the first wafer to the second wafer includes bonding each of the first dice to one of the second die to form a plurality of die combinations, wherein each of the die combinations includes one of the first dice and one of the second dice.

13. The method of claim 12, further comprising:
    separating the plurality of dice combinations into a plurality of single dice combinations.

14. The method of claim 13, wherein the separating includes:
removing wafer material from the first wafer; and
removing wafer material from the second wafer.

15. The method of claim 13, further comprising:
enclosing one of the single dice combinations in an integrated circuit package.

16. The method of claim 13, wherein one of the single dice combinations includes a defective die.

17. The method of claim 10, further including:
replacing a selected die among the plurality of first dice and the plurality of second dice with a third die of a third wafer.

18. The method of claim 17, wherein the selected die includes a defective die.

19. The method of claim 10, further comprising:
contacting a third wafer to one of the first and second wafers, the third wafer including a plurality of third dice, each of the plurality of third dice including a third device portion of the memory device, the third device portion including fewer than all of a plurality of memory cells, a decoder, a sense amplifier, and a control unit of the memory device; and
bonding the third wafer to one of the first and second wafers.

20. The method of claim 19, further comprising:
removing wafer material from one of the first and second wafers before bonding the third wafer to the one of the first and second wafers.

21. The method of claim 10, wherein the first wafer is bonded to a first additional wafer before the first wafer is contacted to the second wafer.

22. The method of claim 21, wherein the second wafer is bonded to a second additional wafer before the first wafer is contacted to the second wafer.

* * * * *